(12) United States Patent
Jung et al.

(10) Patent No.: US 12,317,553 B2
(45) Date of Patent: May 27, 2025

(54) SEMICONDUCTOR DEVICES

(71) Applicant: Samsung Electronics Co., Ltd., Suwon-si (KR)

(72) Inventors: Hyun Ho Jung, Seoul (KR); Dong Kwon Kim, Suwon-si (KR); Cheol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 718 days.

(21) Appl. No.: 17/716,278

(22) Filed: Apr. 8, 2022

(65) Prior Publication Data
US 2023/0031542 A1 Feb. 2, 2023

(30) Foreign Application Priority Data
Jul. 30, 2021 (KR) .................. 10-2021-0100332

(51) Int. Cl.
 *H01L 29/06* (2006.01)
 *H01L 29/66* (2006.01)
 *H10D 62/10* (2025.01)
 *H10D 64/01* (2025.01)

(52) U.S. Cl.
 CPC ......... *H10D 62/118* (2025.01); *H10D 64/017* (2025.01); *H10D 64/021* (2025.01)

(58) Field of Classification Search
 CPC .... H10D 30/014; H10D 30/024; H10D 30/62; H10D 30/6211; H10D 30/6212; H10D 30/6213; H10D 30/6735; H10D 62/118; H10D 62/119; H10D 62/121; H10D 64/015; H10D 64/017; H10D 64/018; H10D 64/021; H10D 84/0158; H10D 84/0193; H10D 84/834; H10D 84/853
 See application file for complete search history.

(56) References Cited

U.S. PATENT DOCUMENTS

| | | | |
|---|---|---|---|
| 9,559,100 B2 | 1/2017 | Chang et al. | |
| 10,504,791 B2 * | 12/2019 | Liou | H10D 84/0151 |
| 10,586,860 B2 | 3/2020 | Shu et al. | |
| 10,651,179 B2 | 5/2020 | Park et al. | |
| 10,825,811 B2 * | 11/2020 | Yang | H10D 84/85 |
| 10,937,786 B2 | 3/2021 | Zang et al. | |
| 2019/0341468 A1 * | 11/2019 | Zang | H10D 62/115 |
| 2019/0341475 A1 * | 11/2019 | Shu | H10D 64/017 |

\* cited by examiner

*Primary Examiner* — David C Spalla
(74) *Attorney, Agent, or Firm* — Myers Bigel, P.A.

(57) ABSTRACT

A semiconductor device includes: a substrate; an active pattern and a field insulating layer surrounding a sidewall of the active pattern on the substrate; first and second gate electrodes on the active pattern and extending in a direction different from that of the active pattern; an interlayer insulating layer surrounding a sidewall of each of the first and second gate electrodes; a gate spacer on opposing sidewalls of each of the first and second gate electrodes that includes a first sidewall and a second sidewall opposite the first sidewall in the first horizontal direction, each of which contacts the interlayer insulating layer; and a first gate cut dividing the second gate electrode into two portions, wherein the first gate cut includes a same material as the gate spacer; and wherein a first width of the first gate cut is smaller than a second width of the gate spacer.

20 Claims, 43 Drawing Sheets

FIG. 7
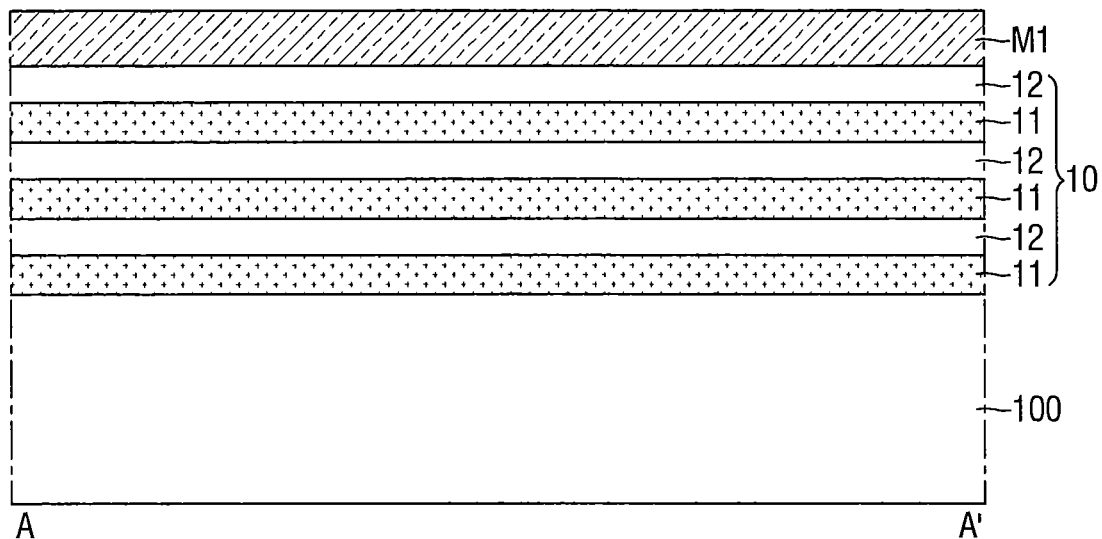
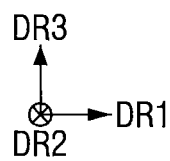
FIG. 8
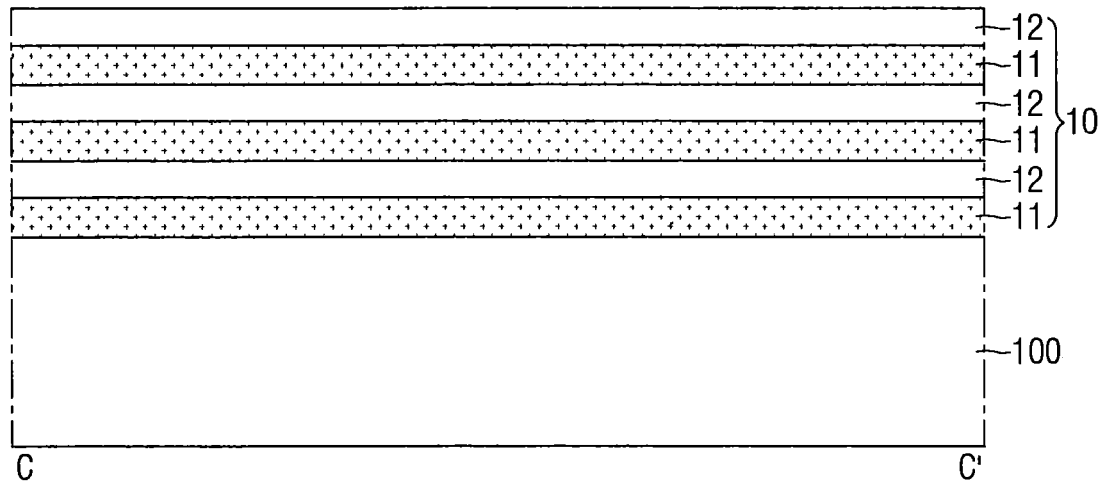
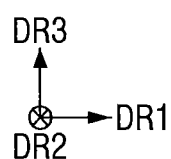

FIG. 9
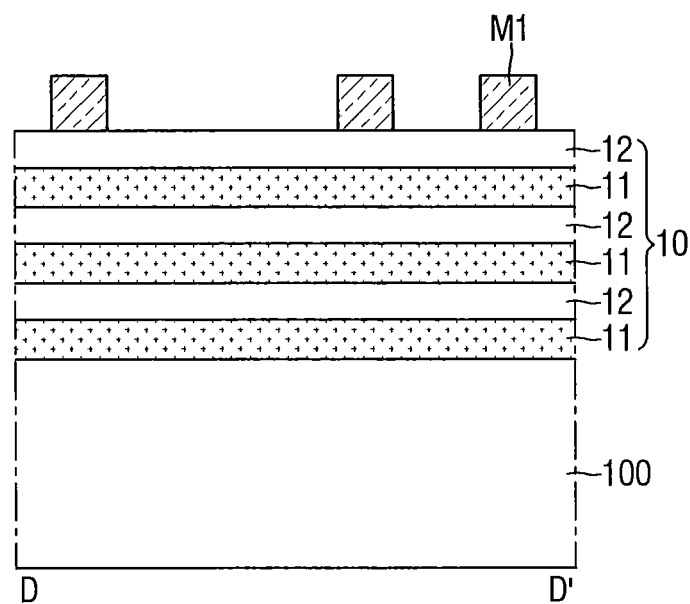
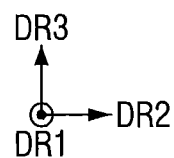
FIG. 10
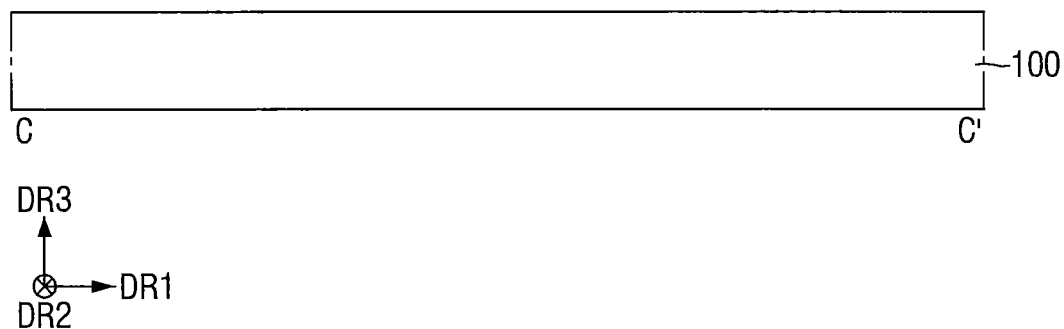

FIG. 17
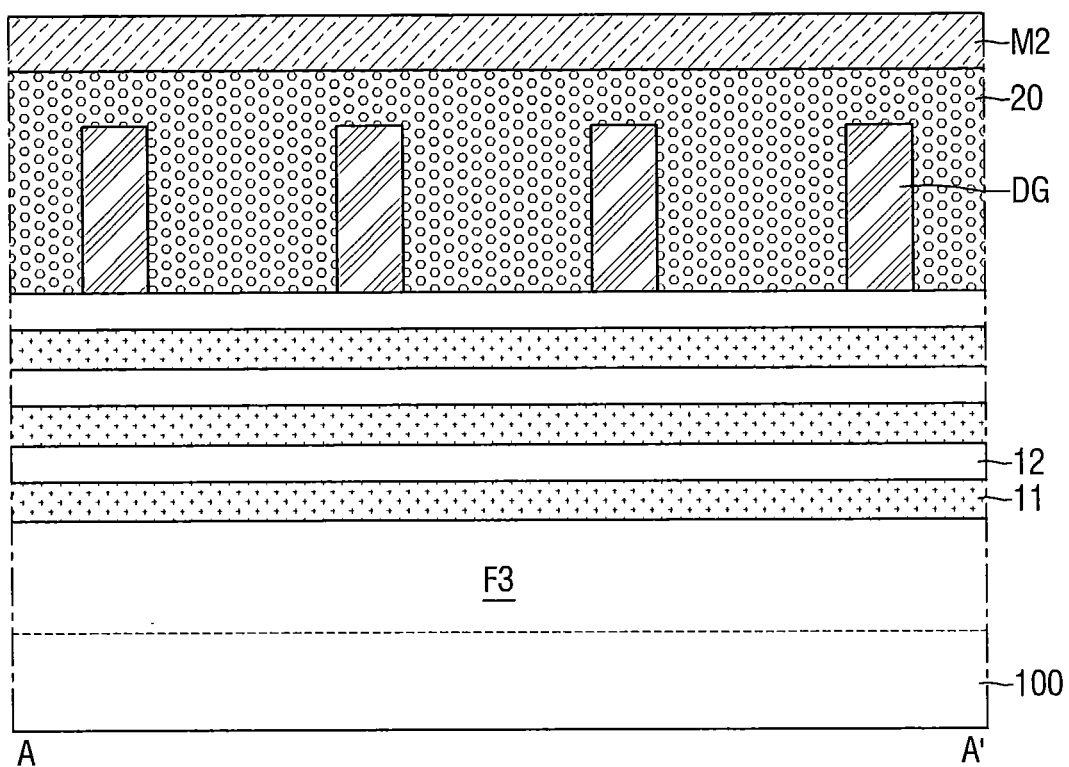
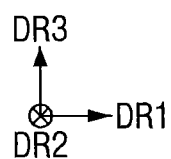

SEMICONDUCTOR DEVICES

CROSS-REFERENCE TO RELATED APPLICATION

This application claims priority from Korean Patent Application No. 10-2021-0100332 filed on Jul. 30, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device. More specifically, the present disclosure relates to a semiconductor device including an MBCFET™ (Multi-Bridge Channel Field Effect Transistor).

2. Description of Related Art

Recently, with rapid spread of information media, functions of a semiconductor device are developing rapidly. Recent semiconductor products require high integration in order to secure competitiveness, low cost and high quality. For the high integration, the semiconductor devices are being scaled down.

Further, as a pitch size of semiconductor devices decreases, there is a need to reduce a capacitance between contacts in the semiconductor device and secure electrical stability.

SUMMARY

A purpose of the present disclosure is to provide a semiconductor device with improved reliability in which a gate cut is formed after a plurality of dummy gates are formed, thereby preventing an interlayer insulating layer from being lost in a process of forming the gate cut.

According to some embodiments of the present disclosure, there is provided a semiconductor device comprising: a substrate; an active pattern on the substrate and extending in a first horizontal direction; a first gate electrode on the active pattern and extending in a second horizontal direction different from the first horizontal direction; a second gate electrode on the active pattern, the second gate electrode extending in the second horizontal direction and spaced apart from the first gate electrode in the first horizontal direction; an interlayer insulating layer surrounding a sidewall of each of the first and second gate electrodes; a gate spacer on opposing sidewalls of each of the first and second gate electrodes and extending in the second horizontal direction, wherein the gate spacer comprises a first sidewall and a second sidewall opposite to the first sidewall in the first horizontal direction, and wherein each of the first and second sidewalls is in contact with the interlayer insulating layer; and a first gate cut dividing the second gate electrode into two portions spaced apart from each other in the second horizontal direction, wherein the first gate cut comprises a material that is the same as a material of the gate spacer, and wherein a first width of the first gate cut in the first horizontal direction is smaller than a second width of the gate spacer in the first horizontal direction.

According to some embodiments of the present disclosure, there is provided a semiconductor device comprising: a substrate; an active pattern on the substrate and extending in a first horizontal direction; a field insulating layer on the substrate and surrounding a sidewall of the active pattern; a trench recessed from an upper surface of the field insulating layer toward the substrate; a first gate electrode on the active pattern and extending in a second horizontal direction different from the first horizontal direction; a second gate electrode on the active pattern, the second gate electrode extending in the second horizontal direction and spaced apart from the first gate electrode in the first horizontal direction; an interlayer insulating layer surrounding a sidewall of each of the first and second gate electrodes; a gate spacer on opposing sidewalls of each of the first and second gate electrodes and extending in the second horizontal direction; a first gate cut dividing the second gate electrode into two portions spaced from each other in the second horizontal direction, wherein at least a portion of the first gate cut is in the trench, and wherein the first gate cut comprises a material that is the same as a material of the gate spacer; and a first connective portion connecting the gate spacer on one sidewall of the first gate electrode to the first gate cut, wherein the first connective portion is at least partially on the upper surface of the field insulating layer and comprises a material that is the same as a material of the gate spacer.

According to some embodiments of the present disclosure, there is provided a semiconductor device comprising: a first cell region; a second cell region adjacent to the first cell region in a first horizontal direction; a comparison region adjacent to each of the first and second cell regions in a second horizontal direction different from the first horizontal direction; a first gate electrode extending across both the first cell region and the comparison region and in the second horizontal direction; a second gate electrode extending across both the first cell region and the comparison region and in the second horizontal direction, wherein the second gate electrode is spaced apart from the first gate electrode in the first horizontal direction; a third gate electrode extending across both the second cell region and the comparison region and in the second horizontal direction, wherein the third gate electrode is spaced apart from the second gate electrode in the first horizontal direction; an interlayer insulating layer surrounding a sidewall of each of the first to third gate electrodes; a gate spacer on opposing sidewalls of each of the first to third gate electrodes and extending in the second horizontal direction, wherein the gate spacer comprises a first sidewall and a second sidewall opposite to the first sidewall in the first horizontal direction, and wherein each of the first and second sidewalls is in contact with the interlayer insulating layer; a first gate cut dividing the second gate electrode into two portions spaced from each other in the second horizontal direction, wherein the first gate cut comprises a material that is the same as a material of the gate spacer; and a second gate cut dividing the third gate electrode into two portions spaced from each other in the second horizontal direction, wherein the second gate cut comprises a material that is the same as a material of the gate spacer, wherein a first width of the first gate cut in the first horizontal direction is smaller than a second width between the first sidewall of the gate spacer and the second sidewall of the gate spacer in the first horizontal direction, and wherein each of opposing sidewalls of the first gate cut has a recess that is concave toward a center of the first gate cut.

Purposes according to the present disclosure are not limited to the above-mentioned purpose. Other purposes and advantages according to the present disclosure that are not mentioned may be understood based on the following descriptions and may be more clearly understood based on embodiments according to the present disclosure. Further, it will be easily understood that the purposes and advantages according to the present disclosure may be realized using means shown in the claims and combinations thereof.

BRIEF DESCRIPTION OF THE DRAWINGS

The above and other aspects and features of the present disclosure will become more apparent by describing in detail exemplary embodiments thereof with reference to the attached drawings, in which:

FIG. 7 to FIG. 37 are diagrams of intermediate steps for illustrating a method for manufacturing a semiconductor device according to some embodiments of the present disclosure;

DETAILED DESCRIPTION OF THE EMBODIMENTS

Figure 1:
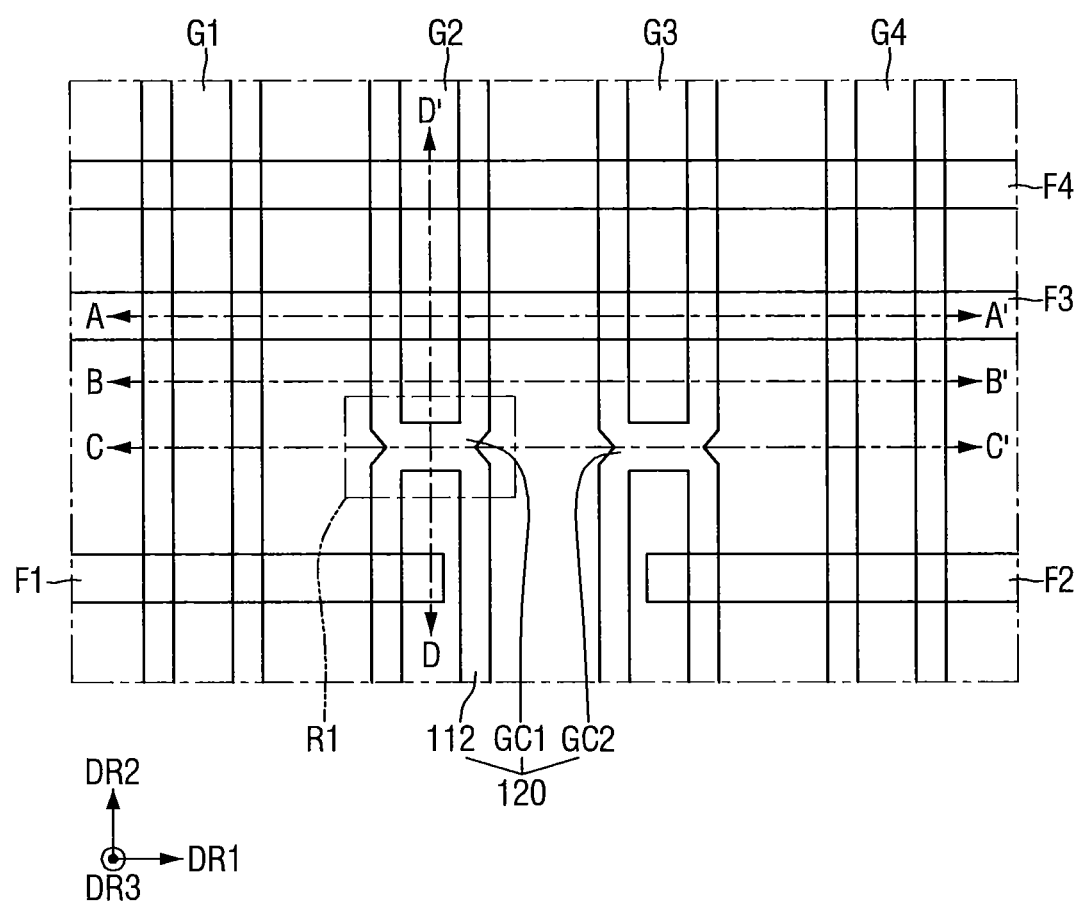
FIG. 1 is a layout diagram for illustrating a semiconductor device according to some embodiments of the present disclosure.

In the drawings related to the semiconductor device according to some embodiments, an example in which the semiconductor device comprises a MBCFET™ (Multi-Bridge Channel Field Effect Transistor) having a nanosheet and a pin-like transistor (FinFET) including a channel region of a pin-like pattern is described. However, the present disclosure is not limited thereto.

Hereinafter, a semiconductor device according to some embodiments of the present disclosure will be described with reference to FIG. 1 to FIG. 6.

Figure 2:
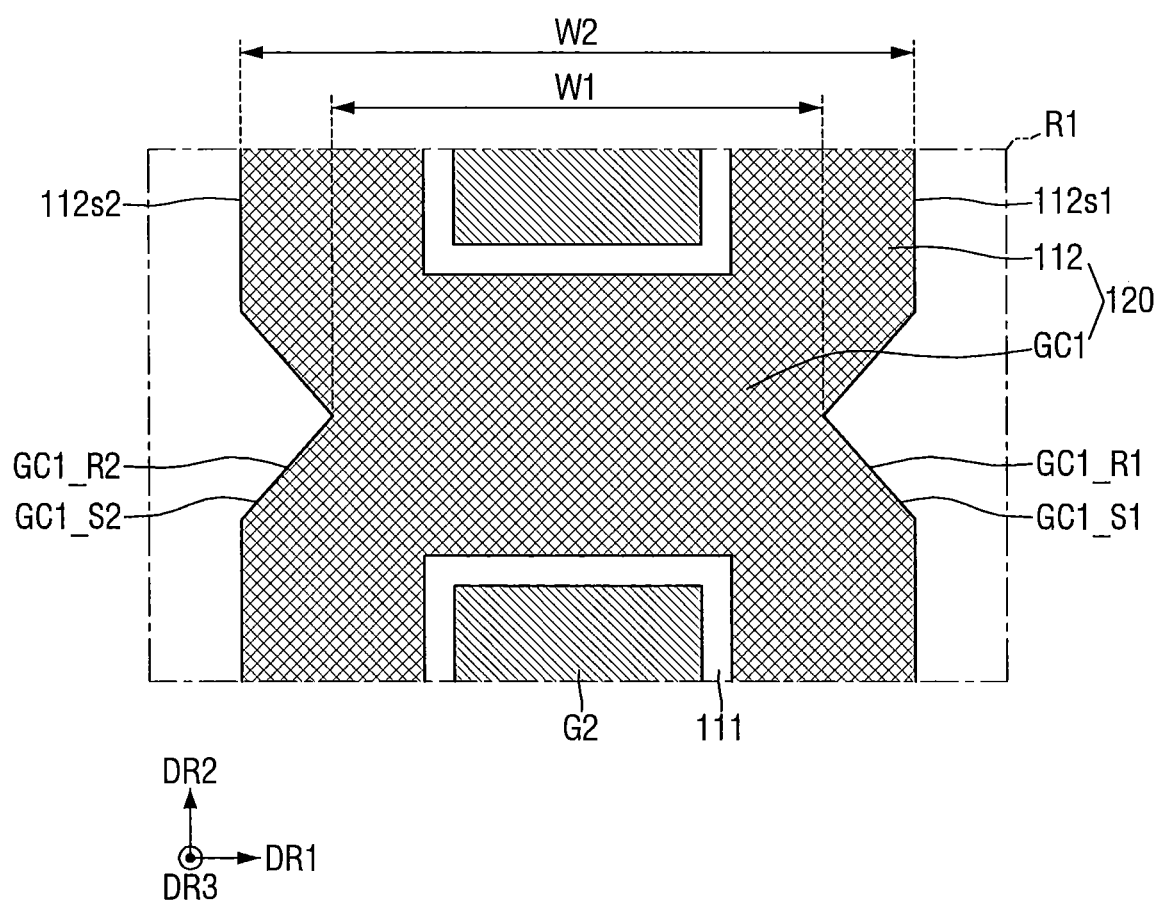
FIG. 2 is an enlarged view of a R1 region of FIG. 1.
Figure 3:
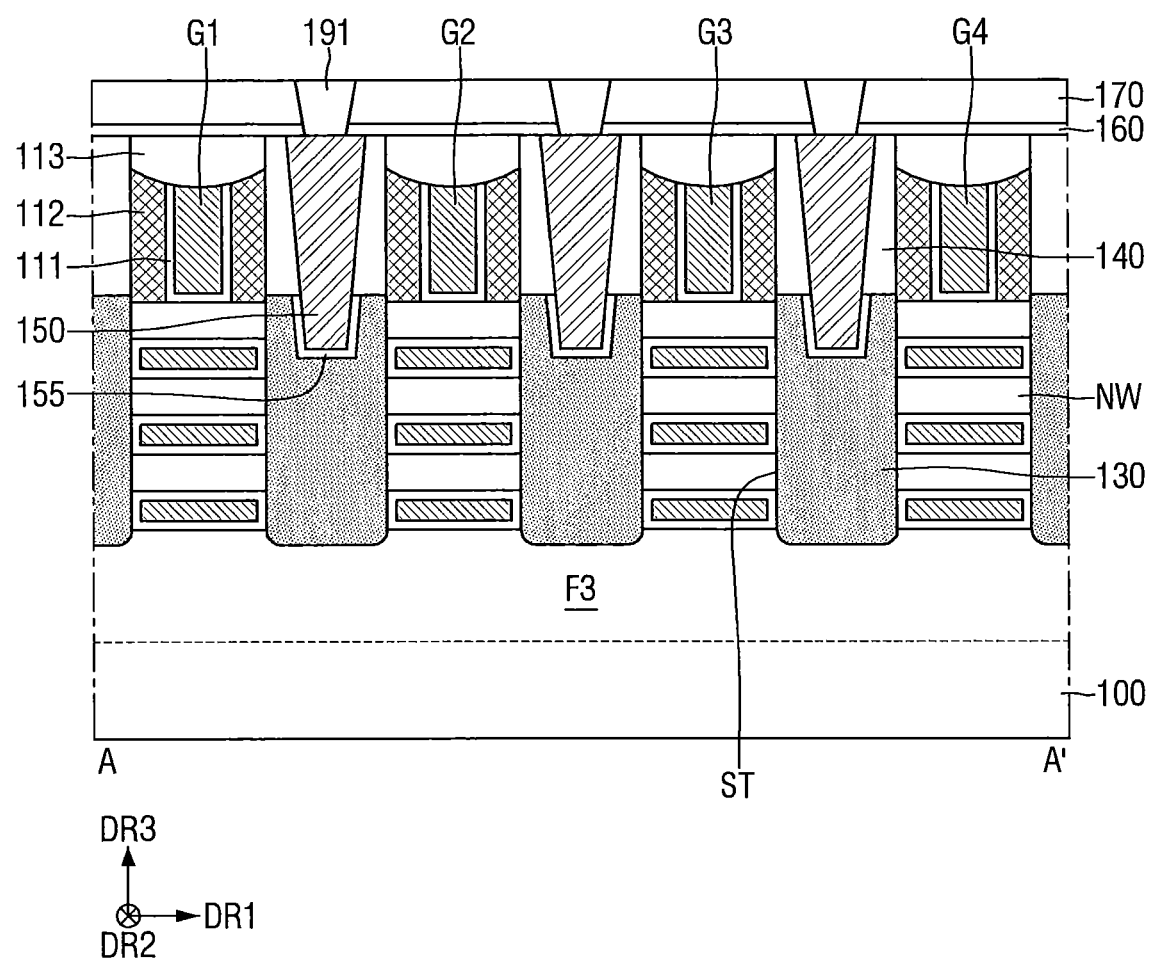
FIG. 3 is a cross-sectional view taken along a line A-A' in FIG. 1.
Figure 4:
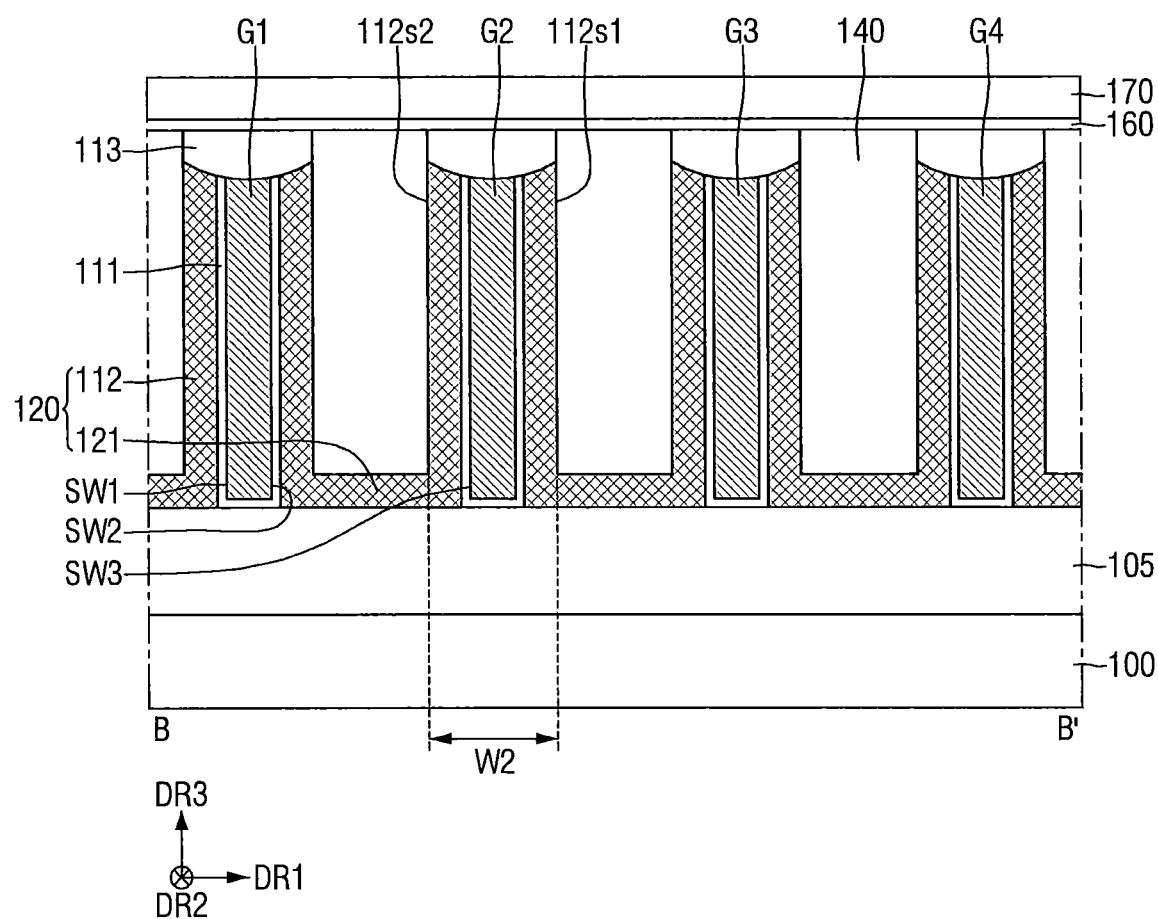
FIG. 4 is a cross-sectional view taken along a line B-B' in FIG. 1.
Figure 5:
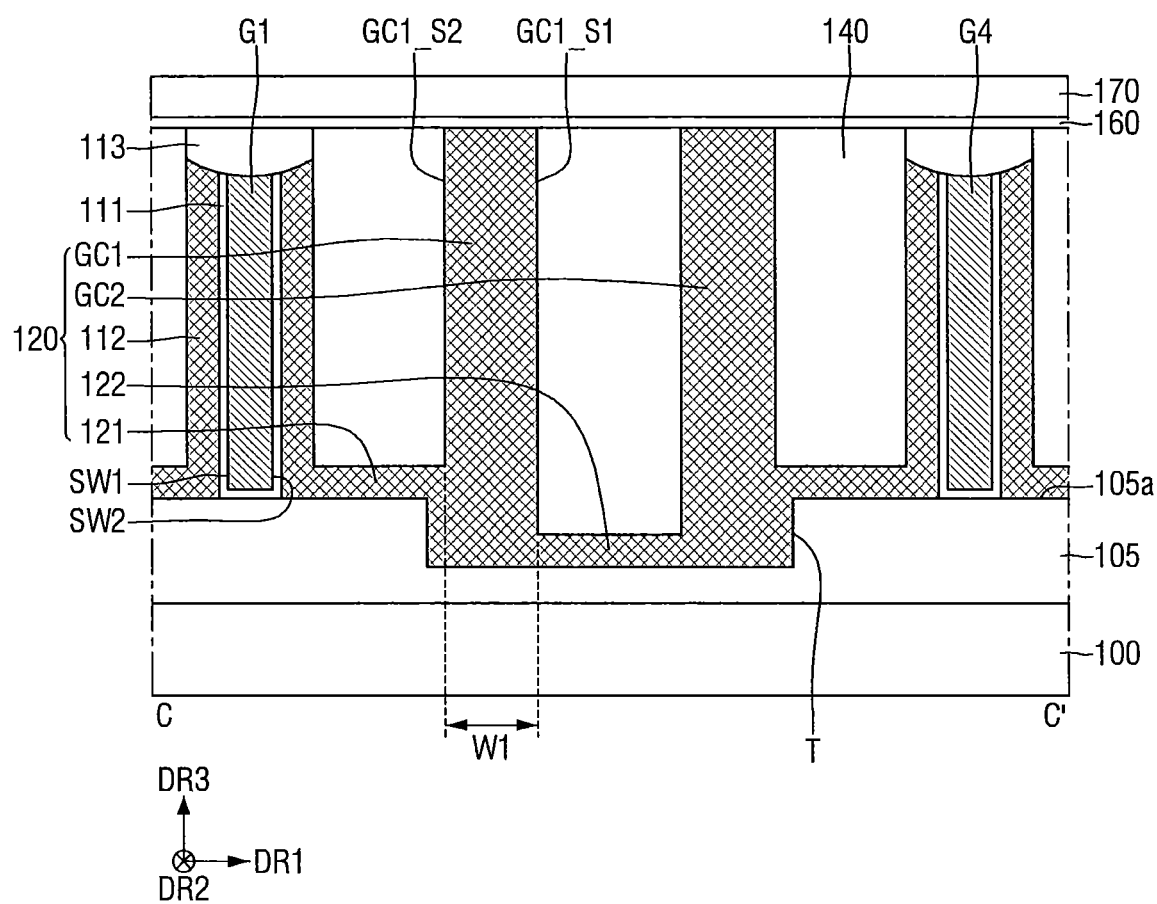
FIG. 5 is a cross-sectional view taken along a line C-C' in FIG. 1.
Figure 6:
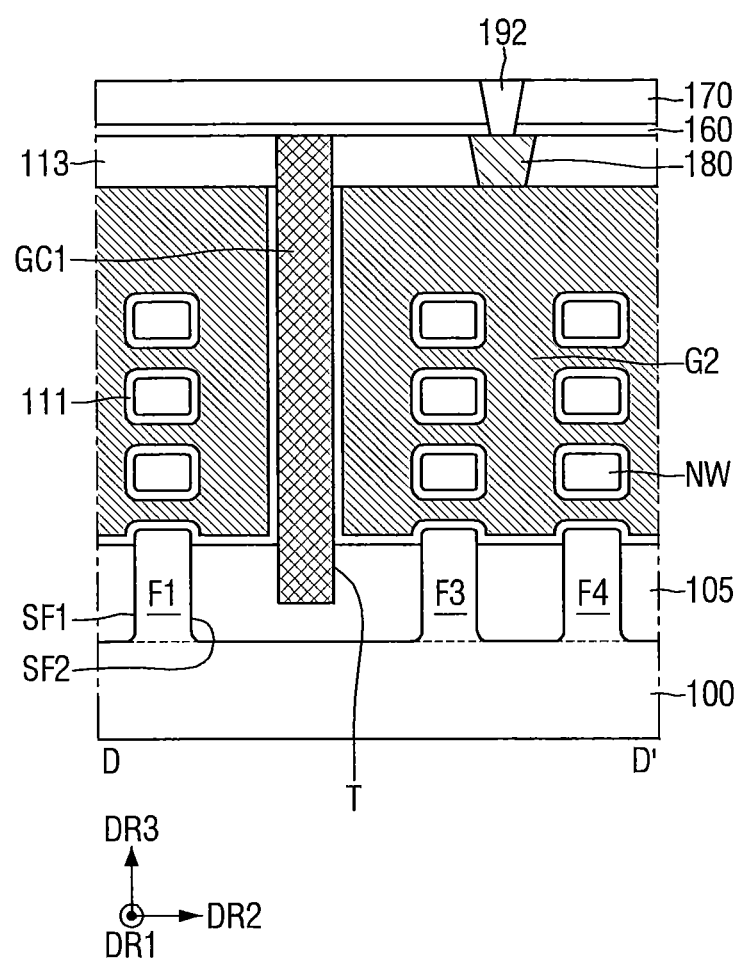
FIG. 6 is a cross-sectional view taken along a line D-D' in FIG. 1.

FIG. 1 is a layout diagram for illustrating a semiconductor device according to some embodiments of the present disclosure. FIG. 2 is an enlarged view of a R1 region of FIG. 1. FIG. 3 is a cross-sectional view taken along a line A-A' in FIG. 1. FIG. 4 is a cross-sectional view taken along a line B-B' in FIG. 1. FIG. 5 is a cross-sectional view taken along a line C-C' in FIG. 1. FIG. 6 is a cross-sectional view taken along a line D-D' in FIG. 1.

Referring to FIG. 1 to FIG. 6, the semiconductor device according to some embodiments of the present disclosure includes a substrate 100, first to fourth active patterns F1, F2, F3, and F4, a field insulating layer 105, a plurality of nanosheets NW, first to fourth gate electrodes G1, G2, G3, and G4, a gate insulating layer 111, a capping pattern 113, a spacer 120, source/drain regions 130, a first interlayer insulating layer 140, source/drain contacts 150, a silicide layer 155, an etch stop layer 160, a second interlayer insulating layer 170, a gate contact 180, a first via 191, and a second via 192.

The substrate 100 may be embodied as a silicon substrate or an SOI (silicon-on-insulator). Alternatively, the substrate 100 may include silicon germanium, SGOI (silicon germanium on insulator), indium antimonide, a lead tellurium compound, indium arsenide, indium phosphide, gallium arsenide or gallium antimonide, but the present disclosure is not limited thereto.

Each of the first to fourth active patterns F1, F2, F3, and F4 may protrude from the substrate 100 in a vertical direction DR3. Each of the first to fourth active patterns F1, F2, F3, and F4 may extend in a first horizontal direction DR1. The second active pattern F2 may be spaced apart from the first active pattern F1 in the first horizontal direction DR1. The third active pattern F3 may be spaced apart from each of the first active pattern F1 and the second active pattern F2 in a second horizontal direction DR2 different from the first horizontal direction DR1. The fourth active pattern F4 may be spaced apart from the third active pattern F3 in the second horizontal direction DR2.

For example, a spacing in the second horizontal direction DR2 between the first active pattern F1 and the third active pattern F3 may be greater than a spacing in the second horizontal direction DR2 between the third active pattern F3 and the fourth active pattern F4.

Each of the first to fourth active patterns F1, F2, F3, and F4 may be a portion of the substrate 100 or may include an epitaxial layer grown from the substrate 100. Each of the first to fourth active patterns F1, F2, F3, and F4 may include, for example, silicon or germanium as an elemental semiconductor material. Further, each of the first to fourth active patterns F1, F2, F3, and F4 may include a compound semiconductor. For example, each of the first to fourth active patterns F1, F2, F3, and F4 may include a IV-IV group compound semiconductor or a III-V group compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto. The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

The field insulating layer 105 may be on the substrate 100. The field insulating layer 105 may surround a sidewall (see, e.g., sidewall SF1 of the first active pattern F1 in FIG. 6) of each of the first to fourth active patterns F1, F2, F3, and F4. It will be understood that "an element A surrounds an element B" (or similar language) as used herein means that the element A is at least partially around the element B but does not necessarily mean that the element A completely encloses the element B. Each of the first to fourth active patterns F1, F2, F3, and F4 may protrude in the vertical direction DR3 upwardly beyond an upper surface 105a of the field insulating layer 105. The field insulating layer 105 may include, for example, an oxide film, a nitride film, an oxynitride film, or a combination thereof.

Referring to FIGS. 5 and 6, a trench T may be formed, wherein at least a portion of the trench T is formed inside the field insulating layer 105. Specifically, the trench T may be formed to be recessed from the upper surface 105a of the field insulating layer 105 toward the substrate 100. A bottom surface of trench T may be positioned inside the field insulating layer 105.

The plurality of nanosheets NW may be disposed above each of the first to fourth active patterns F1, F2, F3, and F4. The plurality of nanosheets NW may include a plurality of stacked nanosheets spaced apart from each other in the vertical direction DR3. The plurality of nanosheets NW may be disposed at each location where each of the first to fourth active patterns F1, F2, F3, and F4 and each of the first to fourth gate electrodes G1, G2, G3, and G4 intersect each other. In a non-limiting embodiment, the term "nanosheet" used in the specification may refer to a conductive structure (e.g., semiconductor) having a cross-section substantially perpendicular to a current flowing direction. It will be understood that the nanosheet may include a nanowire.

A plurality of nanosheets NW may be spaced apart from a further plurality of nanosheets NW in the first horizontal direction DR1 or the second horizontal direction DR2. For example, a plurality of nanosheets NW disposed at an intersection between the third active pattern F3 and the first gate electrode G1 may be spaced apart from a plurality of nanosheets NW disposed at an intersection between the third active pattern F3 and the second gate electrode G2 in the first horizontal direction DR1. Further, a plurality of nanosheets NW disposed at an intersection between the first active pattern F1 and the second gate electrode G2 may be spaced apart from a plurality of nanosheets NW disposed at an intersection between the third active pattern F3 and the second gate electrode G2 in the second horizontal direction DR2.

In FIG. 3 and FIG. 6, the plurality of nanosheets NW is shown as including three nanosheets stacked and spaced apart from each other in the vertical direction DR3. However, this is intended for convenience of description. The present disclosure is not limited thereto. In some further embodiments, the plurality of nanosheets NW may include four or more nanosheets stacked and spaced apart from each other in the vertical direction DR3.

Each of the first gate electrode G1 and the second gate electrode G2 may extend in the second horizontal direction DR2 and may be disposed on the field insulating layer 105, the first active pattern F1, the third active pattern F3, and the fourth active pattern F4. The second gate electrode G2 may be spaced apart from the first gate electrode G1 in the first horizontal direction DR1.

Each of the third gate electrode G3 and the fourth gate electrode G4 may extend in the second horizontal direction DR2 and may be disposed on the field insulating layer 105, the second active pattern F2, the third active pattern F3, and the fourth active pattern F4. The third gate electrode G3 may be spaced apart from the second gate electrode G2 in the first horizontal direction DR1. The fourth gate electrode G4 may be spaced apart from the third gate electrode G3 in the first horizontal direction DR1.

Each of the first to fourth gate electrodes G1, G2, G3, and G4 may surround the plurality of nanosheets NW. Each of the first to fourth gate electrodes G1, G2, G3, and G4 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to fourth gate electrodes G1, G2, G3, and G4 may include a conductive metal oxide, a conductive metal oxynitride, and the like, or may include an oxidation product of the above-mentioned material.

Referring to FIG. 3, the source/drain region 130 may be disposed inside a source/drain trench ST formed on at least one side of each of the first to fourth gate electrodes G1, G2, G3, and G4 and may be on each of the first to fourth active patterns F1, F2, F3, and F4. The source/drain region 130 may be in contact with one or more of the plurality of nanosheets NW. FIG. 3 shows an example in which a vertical level of an upper surface of the source/drain region 130 is higher than that of an upper surface of the uppermost nanosheet of the plurality of nanosheets NW. However, the present disclosure is not limited thereto.

The first interlayer insulating layer 140 may surround each of the first to fourth gate electrodes G1, G2, G3, and G4 and may be on the field insulating layer 105. The first interlayer insulating layer 140 may include, for example, at least one of silicon oxide, silicon nitride, silicon oxynitride, and a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, amorphous fluorinated carbon, silica aerogels, silica xerogels, mesoporous silica and combinations thereof. However, the present disclosure is not limited thereto.

The spacer 120 may be on at least one of sidewalls SW1 and SW2 of each of the first to fourth gate electrodes G1, G2, G3, and G4 and the upper surface 105a of the field insulating layer 105. The spacer 120 may include a gate spacer 112, a first gate cut GC1, a second gate cut GC2, a first connective portion 121 and a second connective portion 122.

The gate spacer 112 may extend in the second horizontal direction DR2 and be on the sidewalls of each of the first to fourth gate electrodes G1, G2, G3, and G4 (see, e.g., sidewalls SW1 and SW2 of the first gate electrode G1 on FIGS. 4 and 5) and may be on the field insulating layer 105. The gate spacer 112 may be on the uppermost nanosheet of the plurality of nanosheets NW. The gate spacer 112 may include a first sidewall 112s1 and a second sidewall 112s2 opposite to the first sidewall 112s1 in the first horizontal direction DR1. Each of the first sidewall 112s1 and the second sidewall 112s2 may contact the first interlayer insulating layer 140.

The first gate cut GC1 may divide the second gate electrode G2 into two portions spaced from each other in the second horizontal direction DR2. For example, as seen in FIG. 6, the first gate cut GC1 may be on the field insulating layer 105 and between the first active pattern F1 and the third active pattern F3. At least a portion of the first gate cut GC1 may be in the trench T. That is, a vertical level of a bottom surface of the first gate cut GC1 may be lower than that of the upper surface 105a of the field insulating layer 105 (see, e.g., FIG. 5). For example, the first gate cut GC1 may extend to an upper surface of the first interlayer insulating layer 140.

Both opposing sidewalls GC1_S1 and GC1_S2 in the first horizontal direction DR1 of the first gate cut GC1 may be concave toward a center of the first gate cut GC1. Specifically, referring to FIG. 2, the first gate cut GC1 may include a first recess GC1_R1 formed on a first side and a second recess GC1_R2 formed on a second side opposite to the first side in the first horizontal direction DR1. Each of the first recess GC1_R1 and the second recess GC1_R2 may be concave toward the center of the first gate cut GC1.

A first width W1 of the first gate cut GC1 in the first horizontal direction DR1 may be smaller than a second width W2 of the gate spacer 112 in the first horizontal direction DR1. Specifically, the first width W1 between the first recess GC1_R1 and the second recess GC1_R2 in the first horizontal direction DR1 may be smaller than the second width W2 between the first sidewall 112s1 of the gate spacer 112 and the second sidewall 112s2 of the gate spacer 112 in the first horizontal direction DR1.

The second gate cut GC2 may divide the third gate electrode G3 into two portions spaced from each other in the second horizontal direction DR2. For example, the second gate cut GC2 may be on the field insulating layer 105 and between the second active pattern F2 and the third active pattern F3. At least a portion of the second gate cut GC2 may be in the trench T. That is, a vertical level of a bottom surface of the second gate cut GC2 may be lower than that of the upper surface 105a of the field insulating layer 105 (see, e.g., FIG. 5). For example, the second gate cut GC2 may extend to the upper surface of the first interlayer insulating layer 140.

The second gate cut GC2 may have a shape similar to that of the first gate cut GC1. For example, both opposing sidewalls in the first horizontal direction DR1 of the second gate cut GC2 may be concave toward a center of the second gate cut GC2. A width in the first horizontal direction DR1 of the second gate cut GC2 may be smaller than a width in the first horizontal direction DR1 of the gate spacer 112.

Referring to FIGS. 4 and 5, the first connective portion 121 of the spacer 120 may be between adjacent ones of the first to fourth gate electrodes G1, G2, G3, and G4 and may be on the field insulating layer 105. The first connective portion 121 may connect adjacent gate spacers 112 to each other. For example, as shown in FIG. 4, the first connective portion 121 may connect the gate spacer 112 on the sidewall SW2 of the first gate electrode G1 and the gate spacer 112 on the sidewall SW3 of the second gate electrode G2 to each other. Further, in a similar fashion, the first connective portion 121 may connect the gate spacer 112 on the sidewall of the second gate electrode G2 and the gate spacer 112 on the sidewall of the third gate electrode G3 to each other.

Referring to FIG. 5, the first connective portion 121 may be between the first gate electrode G1 and the first gate cut GC1 and between the second gate cut GC2 and the fourth gate electrode G4. The first connective portion 121 may connect the gate spacer 112 and the first gate cut GC1 to each other. Further, the first connective portion 121 may connect the gate spacer 112 and the second gate cut GC2 to each other. For example, as shown in FIG. 5, the first connective portion 121 may connect the gate spacer 112 on the sidewall SW2 of the first gate electrode G1 and the first gate cut GC1 to each other. Further, in a similar fashion, the first connective portion 121 may connect the gate spacer 112 on the sidewall of the fourth gate electrode G4 and the second gate cut GC2 to each other.

The first connective portion 121 may be disposed along and on the upper surface 105a of the field insulating layer 105. For example, the first connective portion 121 may be on, and conform to, the upper surface 105a of the field insulating layer 105.

The second connective portion 122 may be between the first gate cut GC1 and the second gate cut GC2 and on the field insulating layer 105. The second connective portion 122 may connect the first gate cut GC1 and the second gate cut GC2 to each other. The second connective portion 122 may be in the trench T. For example, the second connective portion 122 may be along a bottom surface of the trench T. For example, the second connective portion 122 may be on, and conform to, the bottom surface of the trench T.

A vertical level of an upper surface of the second connective portion 122 may be lower than that of an upper surface of the first connective portion 121. At least a portion of the first interlayer insulating layer 140 may be disposed in the trench T and on the second connective portion 122. However, the present disclosure is not limited thereto.

The spacer 120 may be integrally formed into a single monolithic structure. For example, as shown in FIG. 5, the gate spacer 112 formed on the sidewall of the first gate electrode G1, the first connective portion 121, the first gate cut GC1, the second connective portion 122, and the second gate cut GC2 may be integrally formed into a single monolithic structure.

The gate spacer 112, the first connective portion 121, the first gate cut GC1, the second connective portion 122, and the second gate cut GC2 may include the same material and thus be monolithic. For example, each of the gate spacer 112, the first connective portion 121, the first gate cut GC1, the second connective portion 122 and the second gate cut GC2 may include, for example, at least one of silicon nitride (SiN), silicon oxynitride (SiON), silicon oxide ($SiO_2$), silicon carbonitride (SiCN), silicon oxycarbonitride (SiOCN), silicon boron nitride (SiBN), silicon oxyboronnitride (SiOBN), silicon oxycarbide (SiOC), and combinations thereof. In some embodiments, two or more of the gate spacer 112, the first connective portion 121, the first gate cut GC1, the second connective portion 122, and the second gate cut GC2 may consist of exactly the same material.

The gate insulating layer 111 may be between each of the first to fourth gate electrodes G1, G2, G3, and G4 and the plurality of nanosheets NW. The gate insulating layer 111 may also be between each of the first to fourth gate electrodes G1, G2, G3, and G4 and the gate spacer 112. The gate insulating layer 111 may also be between each of the first to fourth gate electrodes G1, G2, G3, and G4 and the source/drain region 130. The gate insulating layer 111 may further be between each of the first to fourth gate electrodes G1, G2, G3, and G4 and each of the first to fourth active patterns F1, F2, F3, and F4. The gate insulating layer 111 may also be between each of the first to fourth gate electrodes G1, G2, G3, and G4 and the field insulating layer 105. The gate insulating layer 111 may further be between the second gate electrode G2 and the first gate cut GC1. The gate insulating layer 111 may also be between the third gate electrode G3 and the second gate cut GC2.

The gate insulating layer 111 may include at least one of silicon oxide, silicon oxynitride, silicon nitride, or a high-permittivity material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. The present disclosure is not limited thereto.

The semiconductor device according to some further embodiments may include an NC (negative capacitance) FET using a negative capacitor. For example, the gate insulating layer 111 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on which ferroelectric material the ferroelectric material film includes.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 nanometers (nm) to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the gate insulating layer 111 may include one ferroelectric material film. In another example, the gate insulating layer 111 may include a plurality of ferroelectric material films spaced apart from each other. The gate insulating layer 111 may have a stack film structure in which a plurality of ferroelectric material films and a plurality of paraelectric material films are alternately stacked with each other.

Referring to FIGS. 3-6, a capping pattern 113 may be on each of the first to fourth gate electrodes G1, G2, G3, and G4. The capping pattern 113 may surround a sidewall of each of the first gate cut GC1 and the second gate cut GC2. For example, an upper surface of the capping pattern 113 may be coplanar with an upper surface of each of the first gate cut GC1 and the second gate cut GC2 (see, e.g., FIG. 6).

The capping pattern 113 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

The source/drain contact 150 may extend through the first interlayer insulating layer 140 in the vertical direction DR3 and thus be connected to the source/drain region 130. The source/drain contact 150 may extend into the source/drain region 130. Although it is shown in FIG. 3 that the source/drain contact 150 is composed of a single layer, this is intended for convenience of description. The present disclosure is not limited thereto. That is, the source/drain contact 150 may be composed of multiple layers. The source/drain contact 150 may include a conductive material.

The silicide layer 155 may be between the source/drain region 130 and the source/drain contact 150. The silicide layer 155 may include, for example, a metal silicide material.

The gate contact 180 may extend through the capping pattern 113 in the vertical direction DR3 and thus may be connected to at least one of the first to fourth gate electrodes G1, G2, G3, and G4. Although it is shown in FIG. 6 that the gate contact 180 is composed of a single layer, this is intended for convenience of description. The present disclosure is not limited thereto. That is, the gate contact 180 may be composed of multiple layers. The gate contact 180 may include a conductive material.

The etch stop layer 160 may be on the first interlayer insulating layer 140 and the capping pattern 113. The etch stop layer 160 may be on and cover at least a portion of an upper surface of the source/drain contact 150, and be on and cover at least a portion of an upper surface of the gate contact 180. Although FIG. 3 to FIG. 6 shows that the etch stop layer 160 is composed of a single layer, the present disclosure is not limited thereto. In some further embodiments, the etch stop layer 160 may be composed of multiple layers. The etch stop layer 160 may include, for example, at least one of silicon oxide, silicon nitride, silicon oxynitride, and a low dielectric constant material.

The second interlayer insulating layer 170 may be disposed on the etch stop layer 160.

The second interlayer insulating layer 170 may include, for example, at least one of silicon oxide, silicon nitride, silicon oxynitride, and a low dielectric constant material.

The first via 191 may extend through the second interlayer insulating layer 170 and the etch stop layer 160 in the vertical direction DR3 and thus may be connected to the source/drain contact 150. FIG. 3 shows that the first via 191 is composed of a single layer. However, this is intended for convenience of description. The present disclosure is not limited thereto. That is, the first via 191 may be composed of multiple layers. The first via 191 may include a conductive material.

The second via 192 may extend through the second interlayer insulating layer 170 and the etch stop layer 160 in the vertical direction DR3 and thus may to be connected to the gate contact 180. Although it is shown in FIG. 6 that the second via 192 is composed of a single layer, this is intended for convenience of description. The present disclosure is not limited thereto. That is, the second via 192 may be composed of multiple layers. The second via 192 may include a conductive material.

Although it is shown in FIG. 3 that an inner spacer is not disposed between each of the first to fourth gate electrodes G1, G2, G3, and G4 and the source/drain region 130, the present disclosure is not limited thereto. In some further embodiments, an inner spacer may be between each of the first to fourth gate electrodes G1, G2, G3, and G4 and the source/drain region 130.

Hereinafter, a method for manufacturing a semiconductor device according to some embodiments of the present disclosure will be described with reference to FIG. 7 to FIG. 37.

FIG. 7 to FIG. 37 are diagrams of intermediate steps for illustrating a method for manufacturing a semiconductor device according to some embodiments of the present disclosure.

Referring to FIG. 7 to FIG. 9, a stack structure 10 in which one or more first semiconductor layers 11 and second semiconductor layers 12 are alternately stacked on the substrate 100 may be formed. For example, one of the first semiconductor layers 11 may constitute the lowest portion of the stack structure 10. One of the second semiconductor layers 12 may constitute the highest portion of the stack structure 10. However, the present disclosure is not limited thereto. The first semiconductor layer 11 may include, for example, silicon germanium (SiGe). The second semiconductor layer 12 may include, for example, silicon (Si). Subsequently, a first mask pattern M1 may be formed on the stack structure 10.

Figure 11:
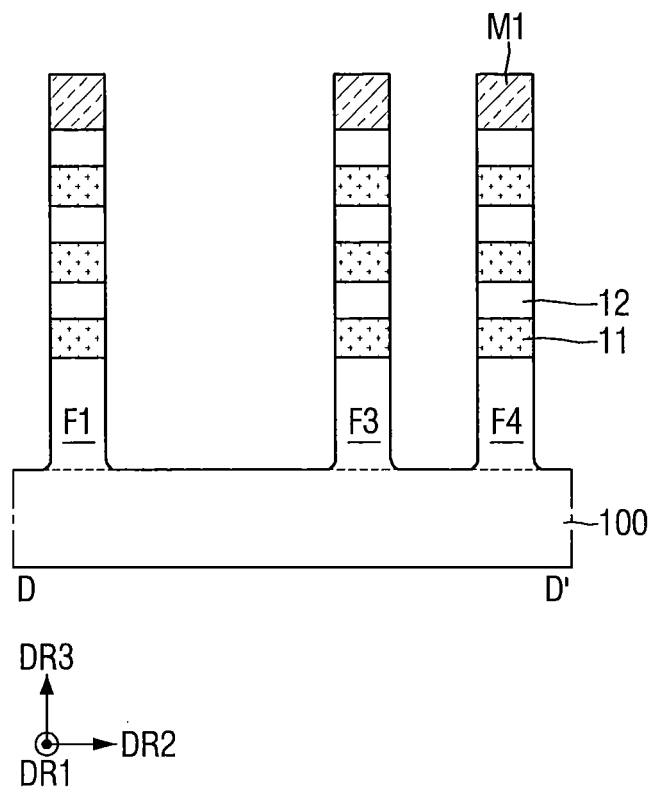

Referring to FIG. 10 and FIG. 11, a portion of each of the stack structure 10 and the substrate 100 may be etched using the first mask pattern M1 as a mask. The first to fourth active patterns F1, F2, F3, and F4 may be formed on the substrate 100 via the etching process. Each of the first to fourth active patterns F1, F2, F3, and F4 may extend in the first horizontal direction DR1.

Figure 12:
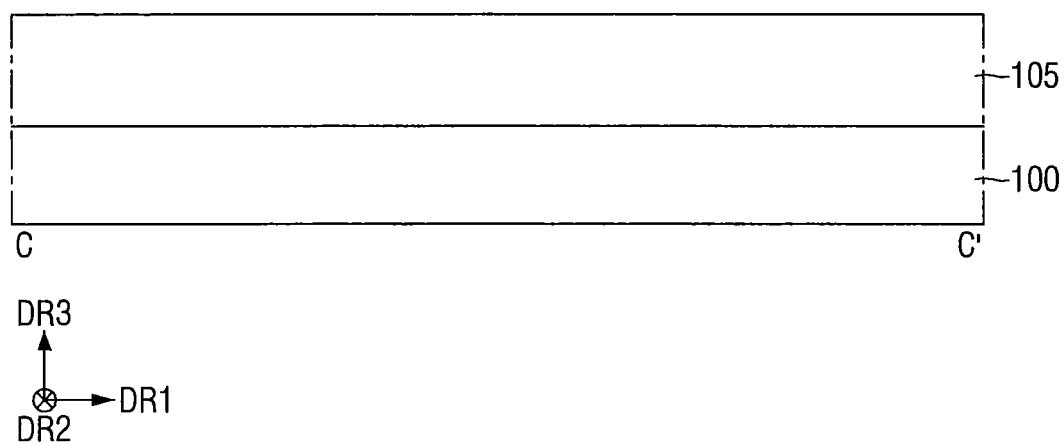
Figure 13:
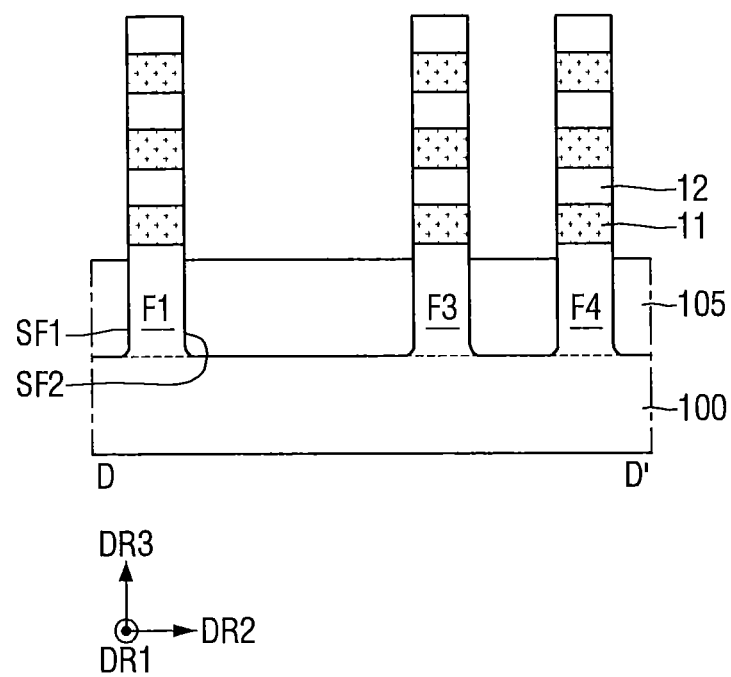

Referring to FIG. 12 and FIG. 13, the field insulating layer 105 may be formed on the substrate 100. The field insulating layer 105 may surround a sidewall (such as SF1 and SF2 of the first active pattern F1 in FIG. 13) of each of the first to fourth active patterns F1, F2, F3, and F4. For example, a vertical level of an upper surface of the field insulating layer 105 may be lower than that of an upper surface of each of the first to fourth active patterns F1, F2, F3, and F4. Subsequently, the first mask pattern M1 may be removed.

Figure 14:
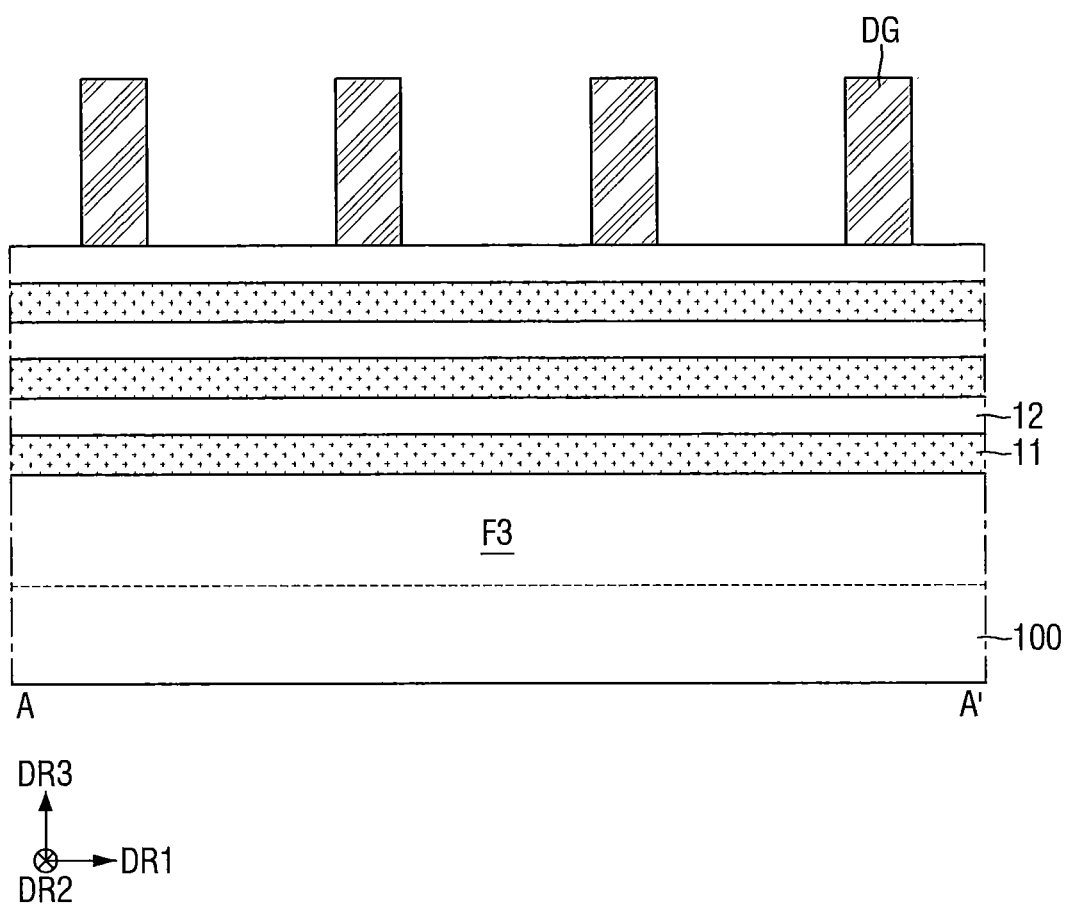
Figure 15:
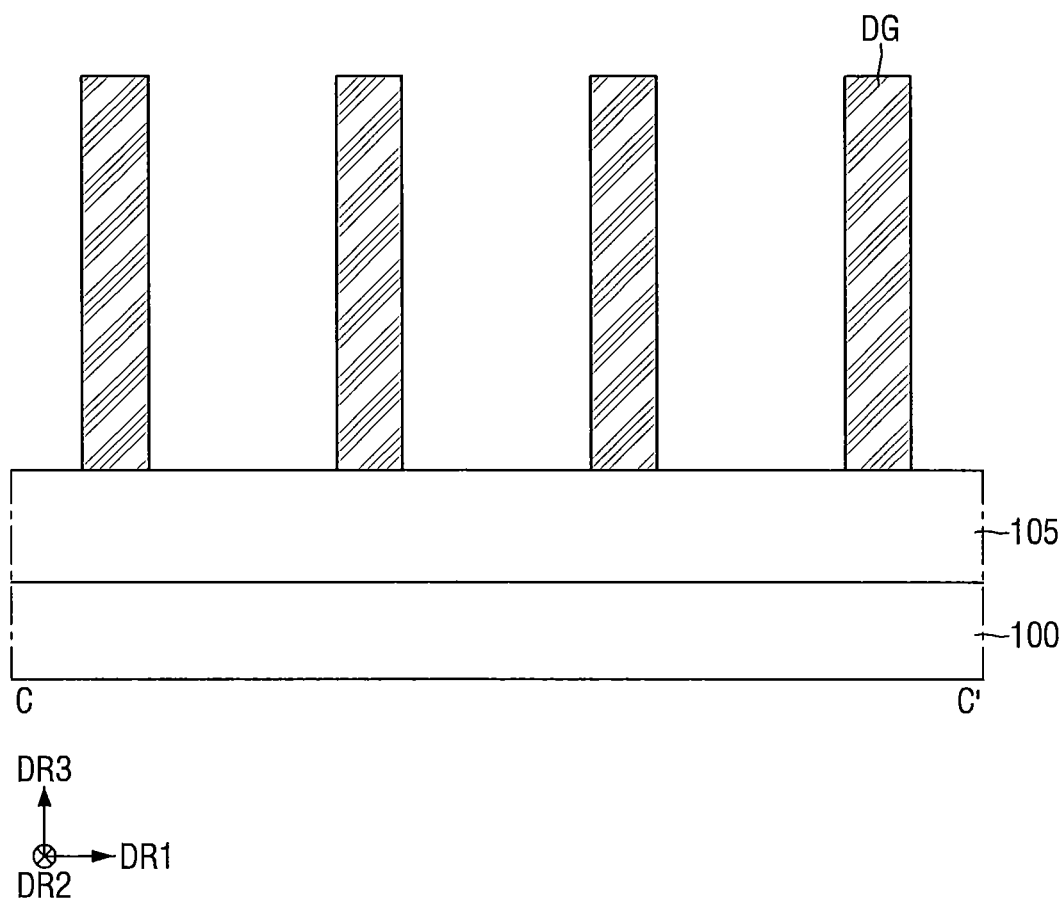
Figure 16:
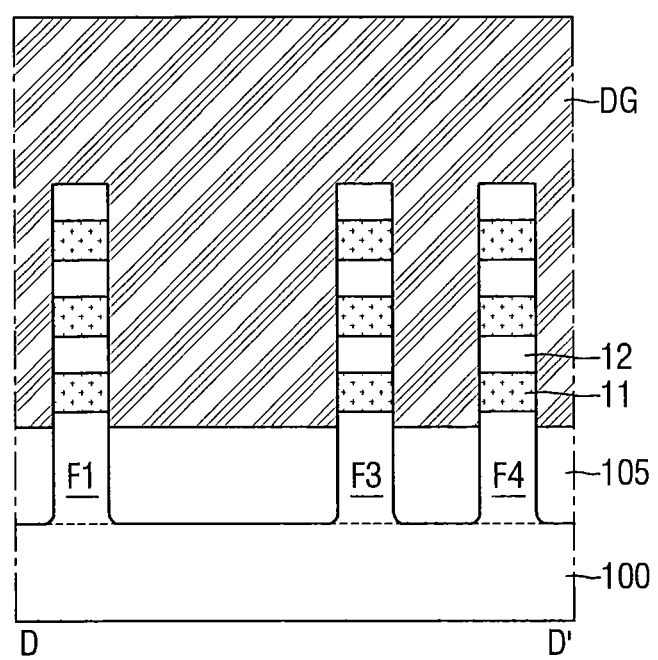

Referring to FIG. 14 to FIG. 16, a plurality of dummy gates DG may be formed on the etched first semiconductor layer 11, the etched second semiconductor layer 12, and the field insulating layer 105. Each of the plurality of dummy gates DG may extend in the second horizontal direction DR2. Each of the plurality of dummy gates DG may be spaced apart from each other in the first horizontal direction DR1.

Figure 18:
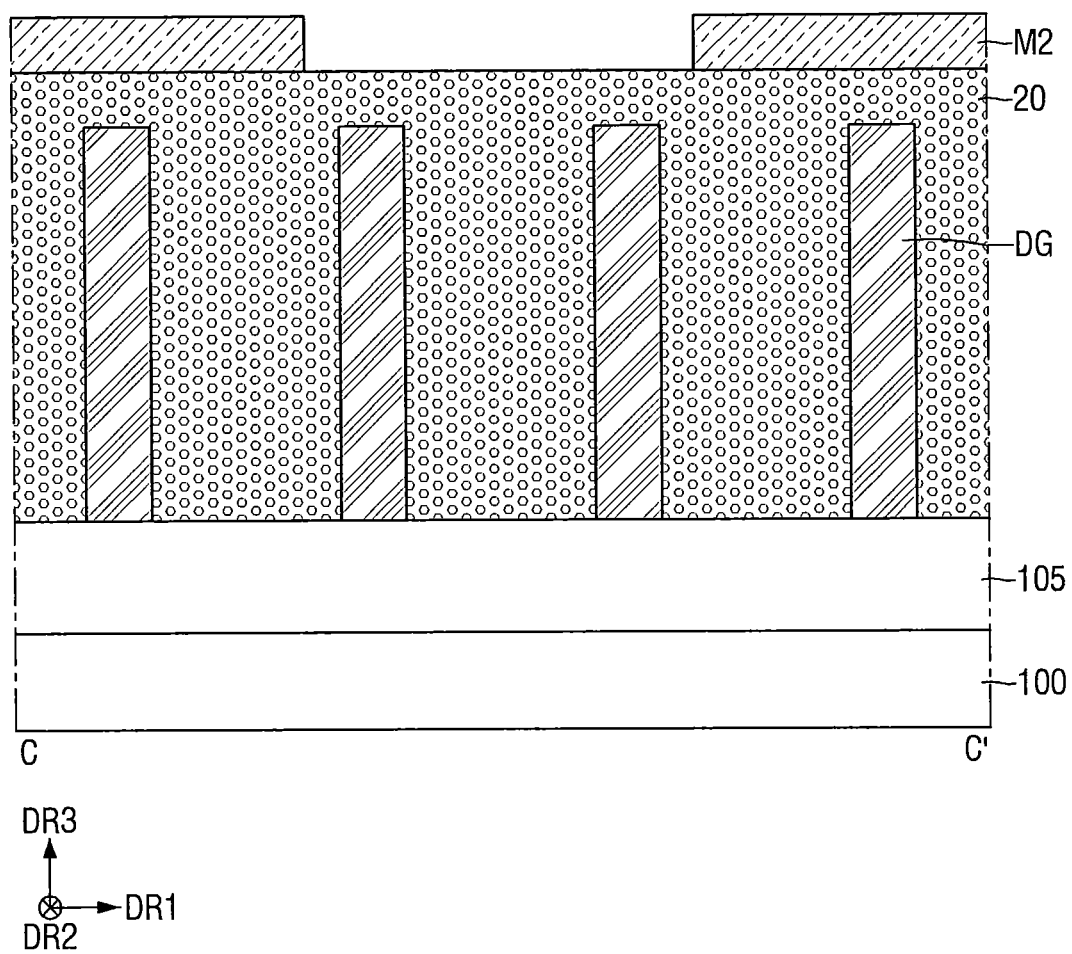
Figure 19:
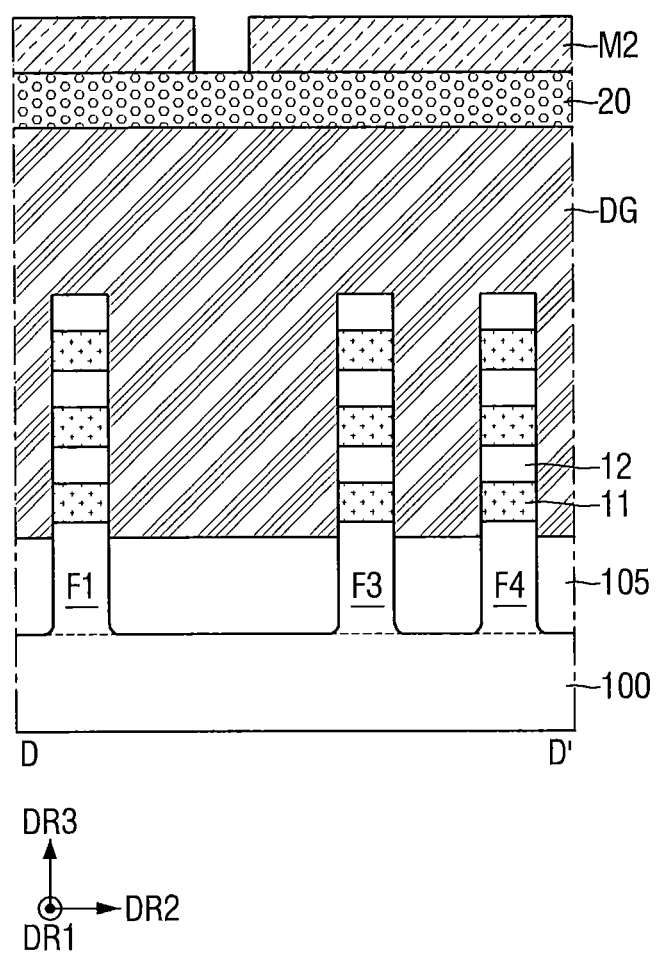

Referring to FIG. 17 to FIG. 19, a protective layer 20 may be formed on the field insulating layer 105 so as to surround and cover at least a portion of one or more of the plurality of dummy gates DG. The protective layer 20 may include, for example, SOH. Subsequently, a second mask pattern M2 may be formed on the protective layer 20.

Figure 20:
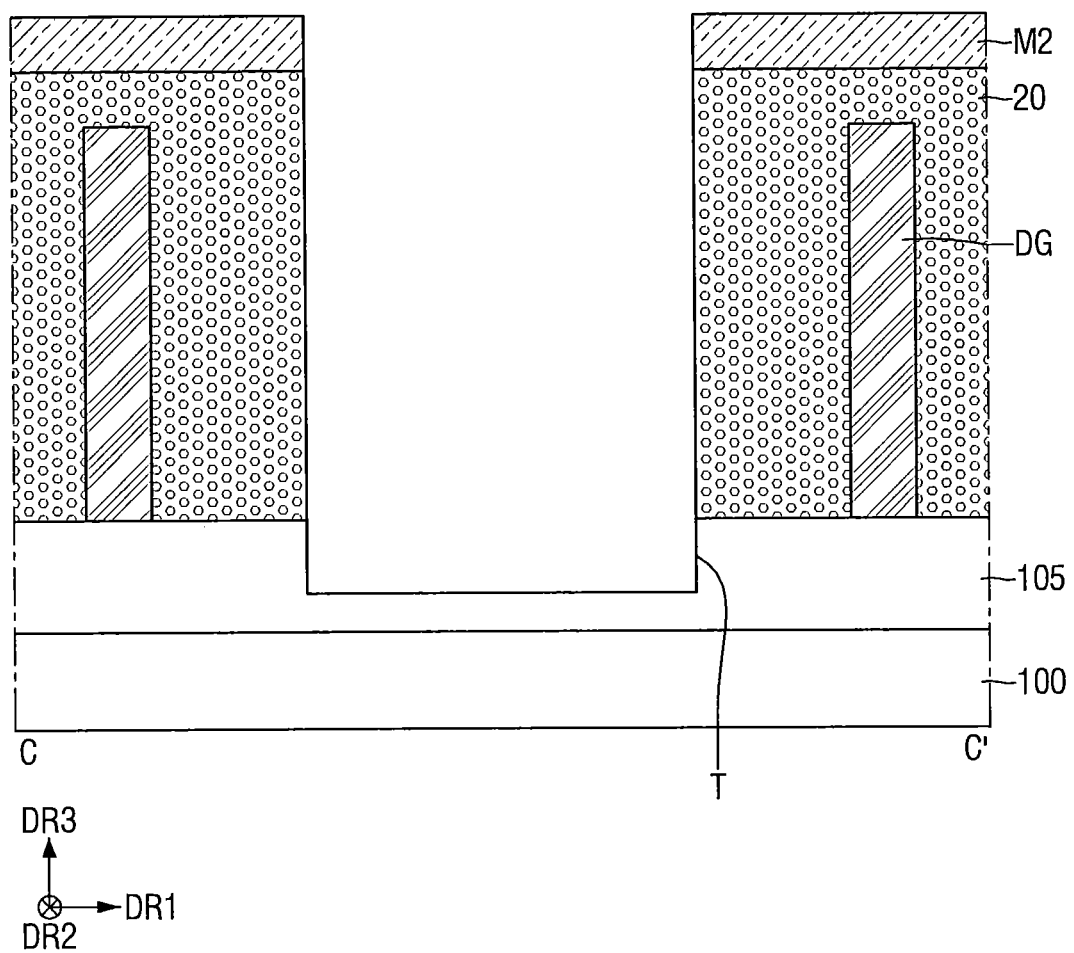
Figure 21:
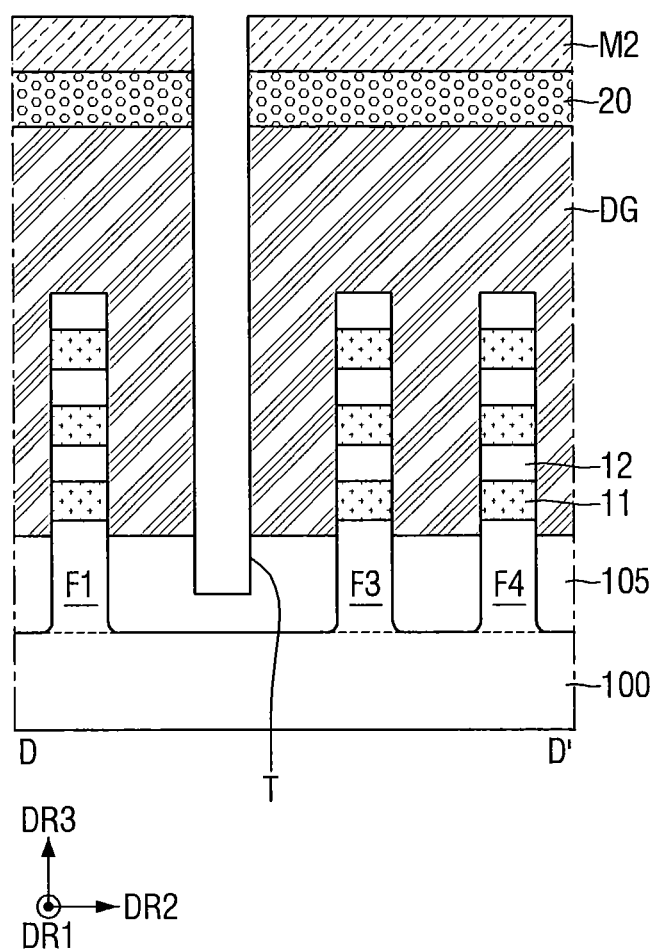

Referring to FIG. 20 and FIG. 21, using the second mask pattern M2 as a mask, a portion of each of the plurality of dummy gates DG and the protective layer 20 may be etched. A portion of the field insulating layer 105 may be etched through the etching process to form the trench T in the field insulating layer 105.

Figure 22:
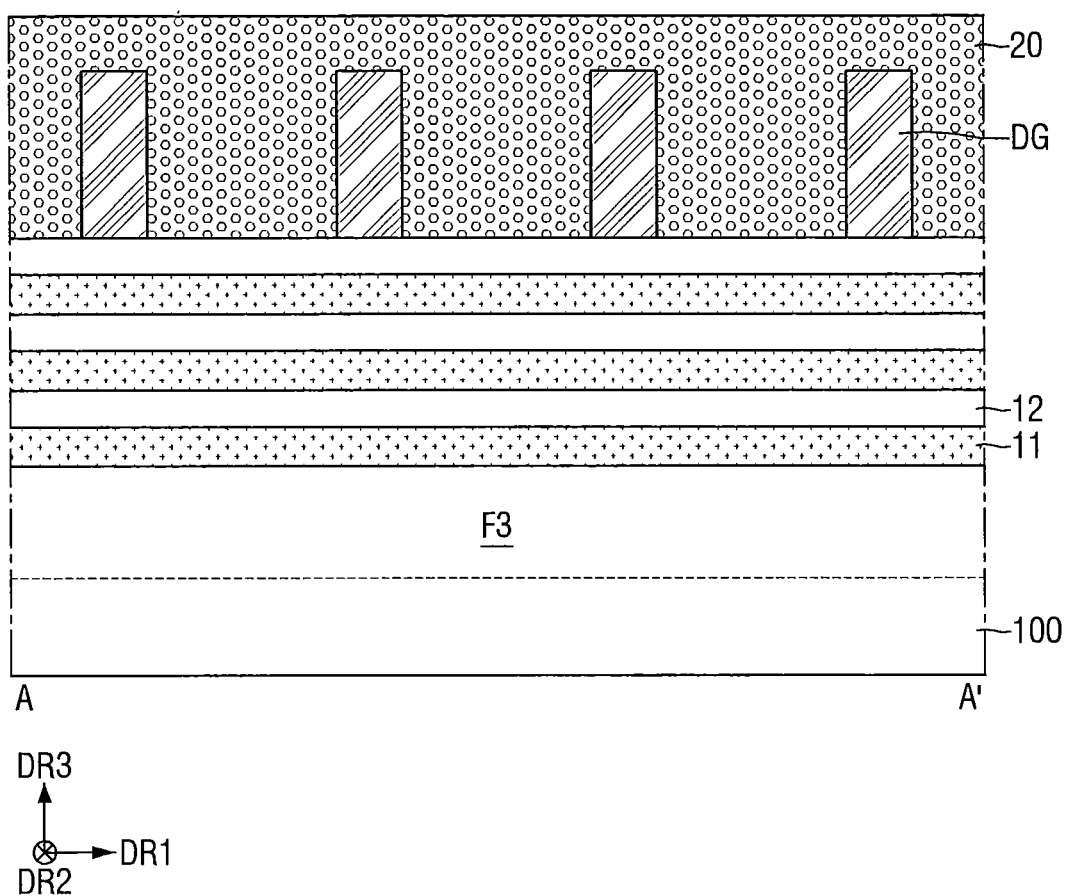
Figure 23:
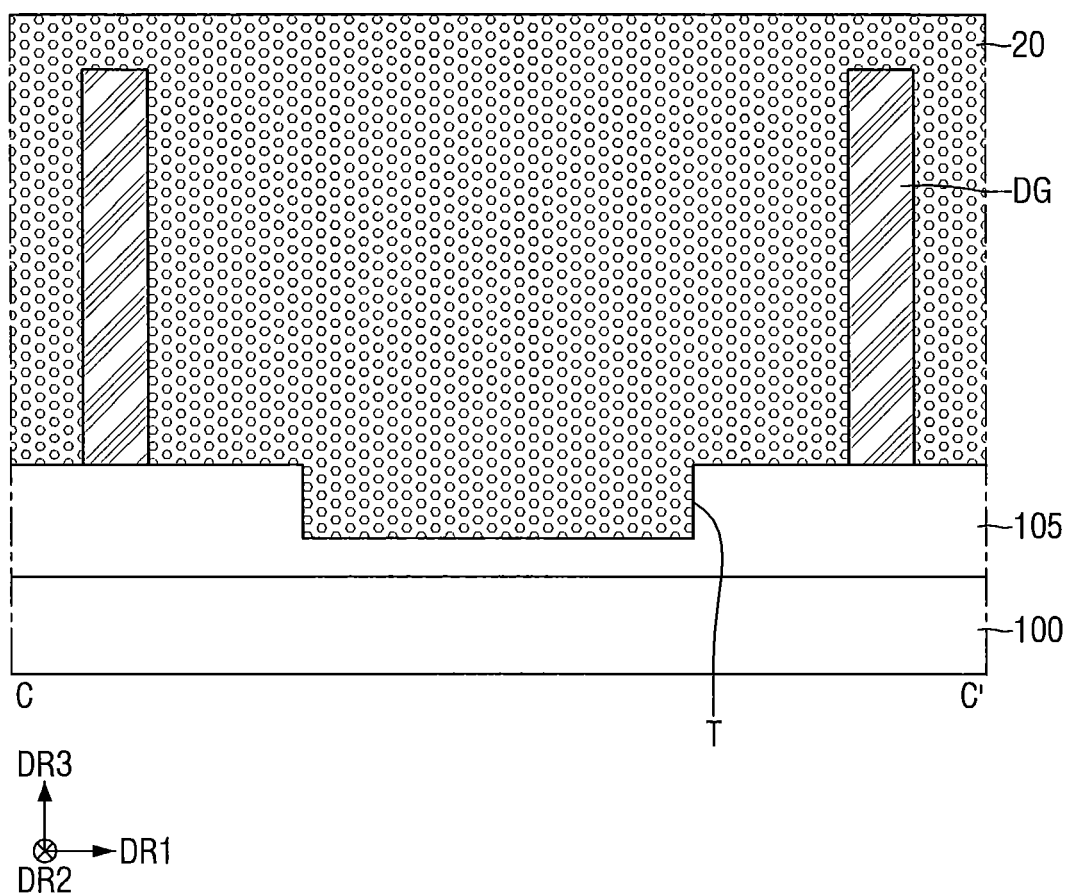
Figure 24:
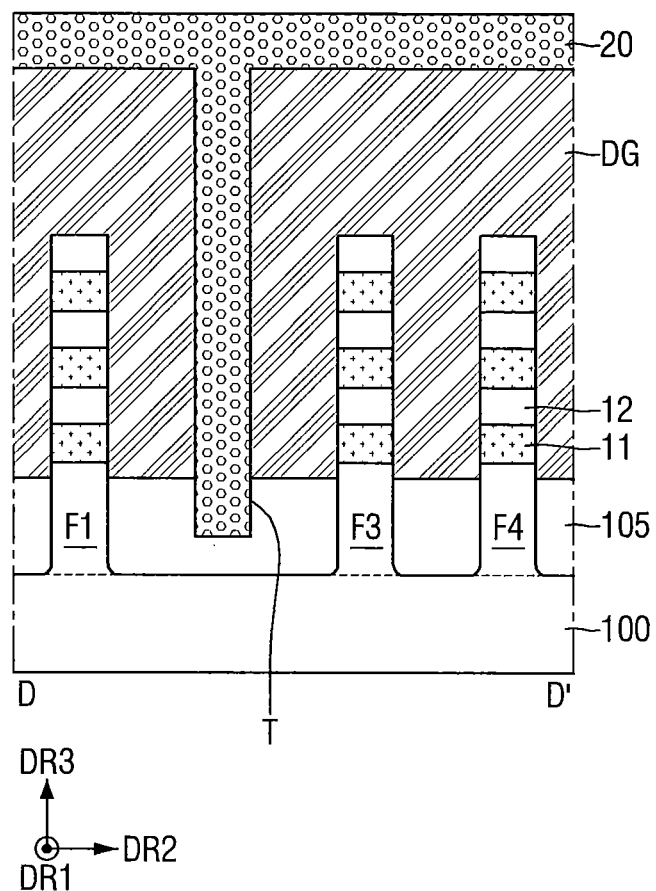

Referring to FIG. 22 to FIG. 24, the protective layer 20 may be formed in the etched portion of each of the plurality of dummy gates DG and in the trench T. Subsequently, the second mask pattern M2 may be removed.

Figure 25:
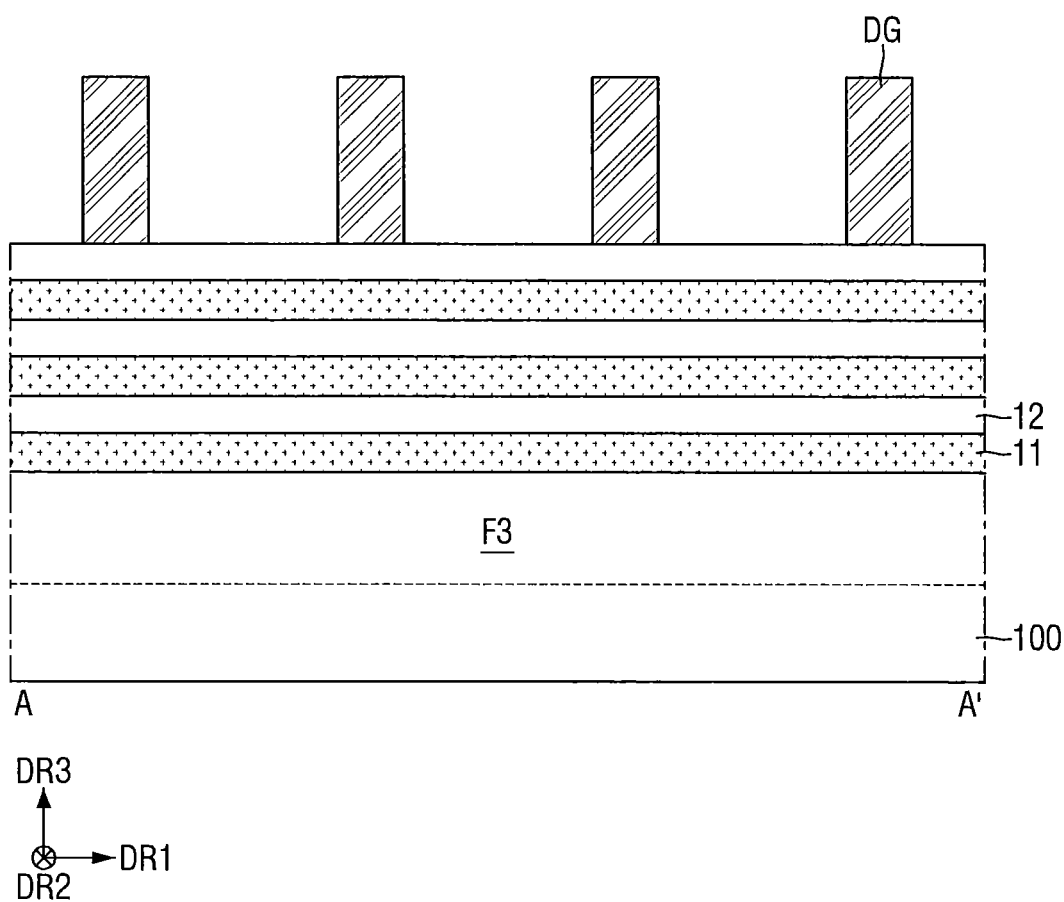
Figure 26:
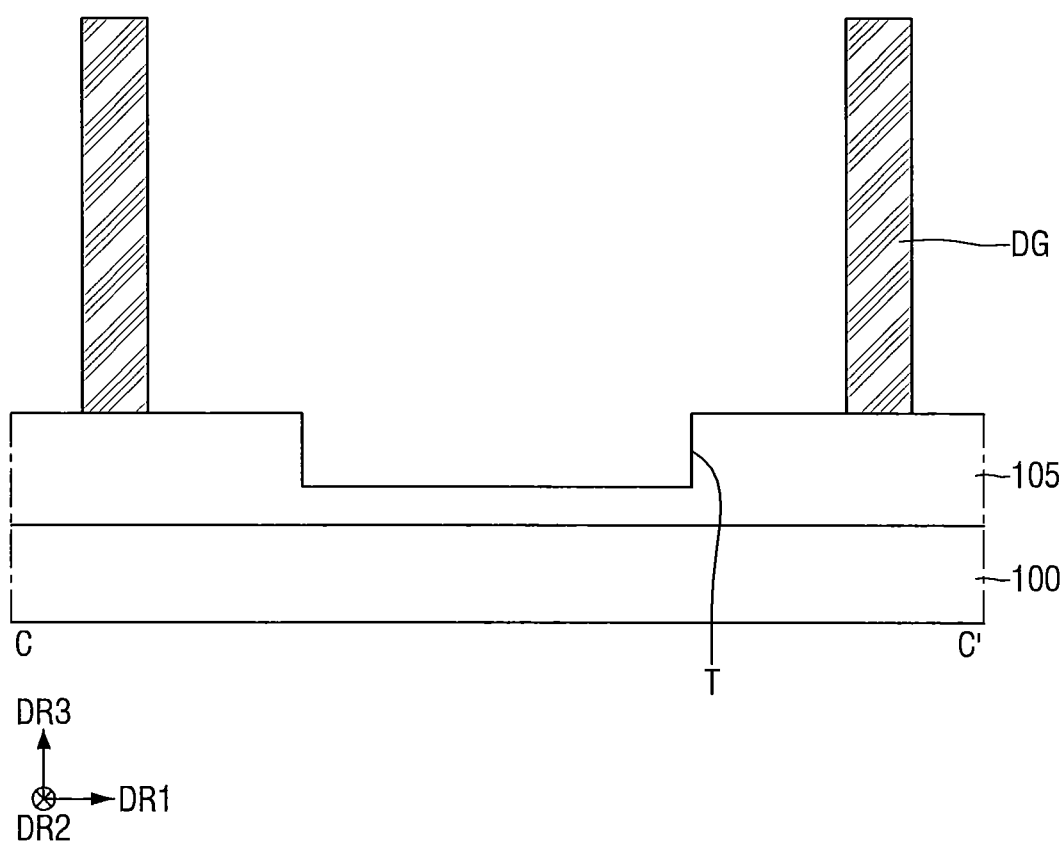
Figure 27:
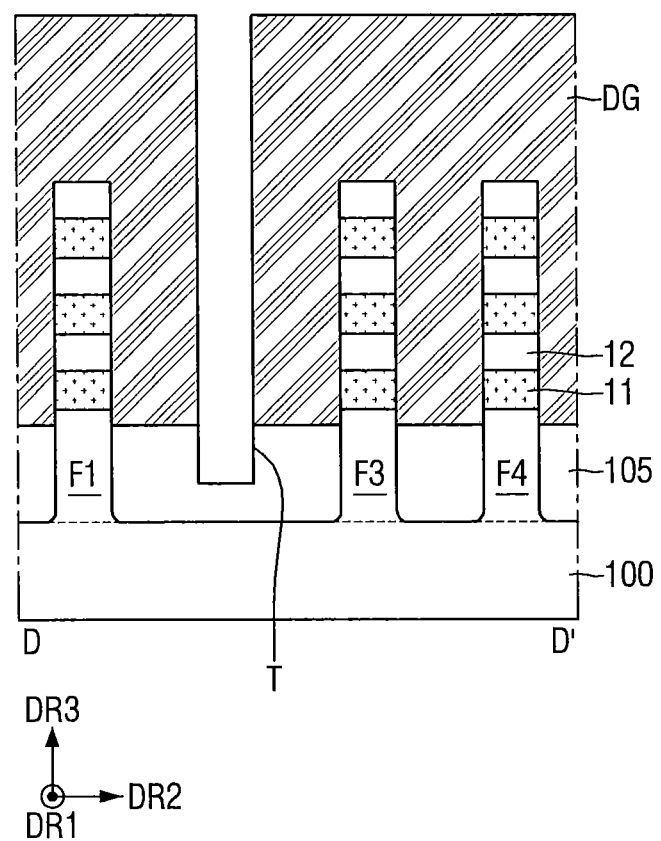

Referring to FIG. 25 to FIG. 27, the protective layer 20 may be removed.

Figure 28:
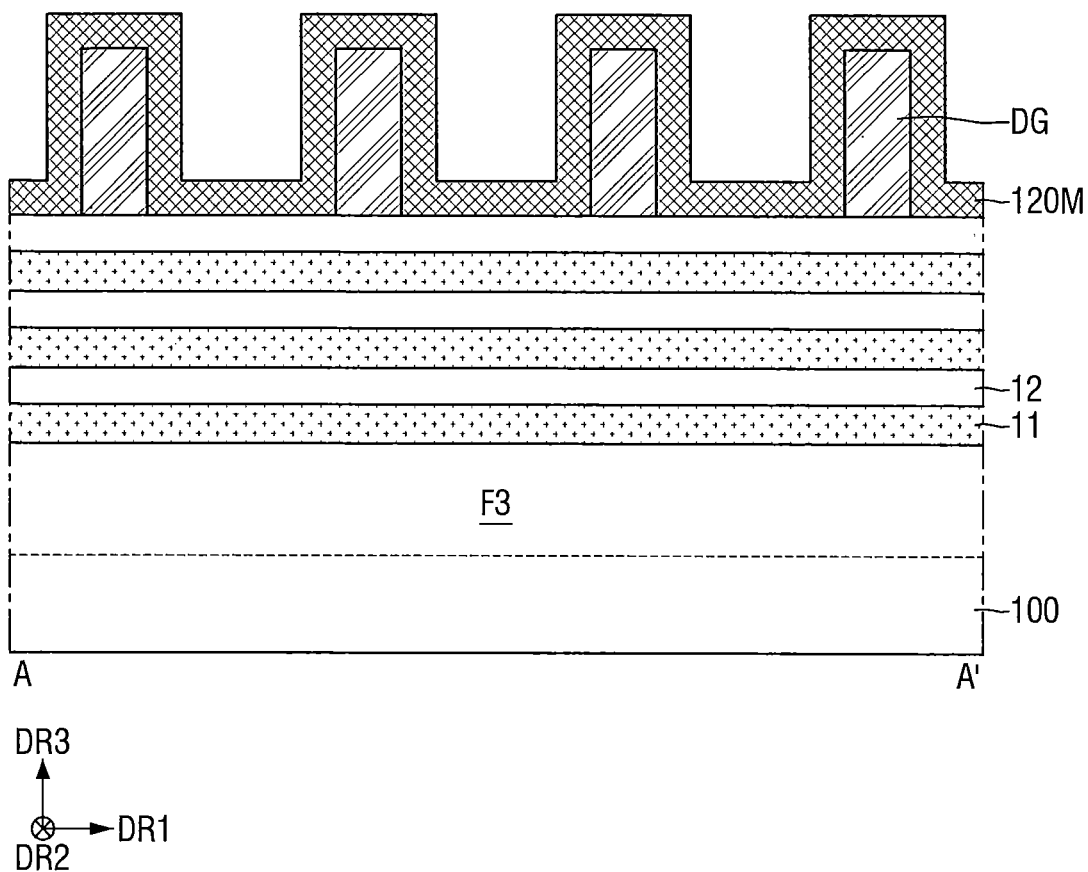
Figure 29:
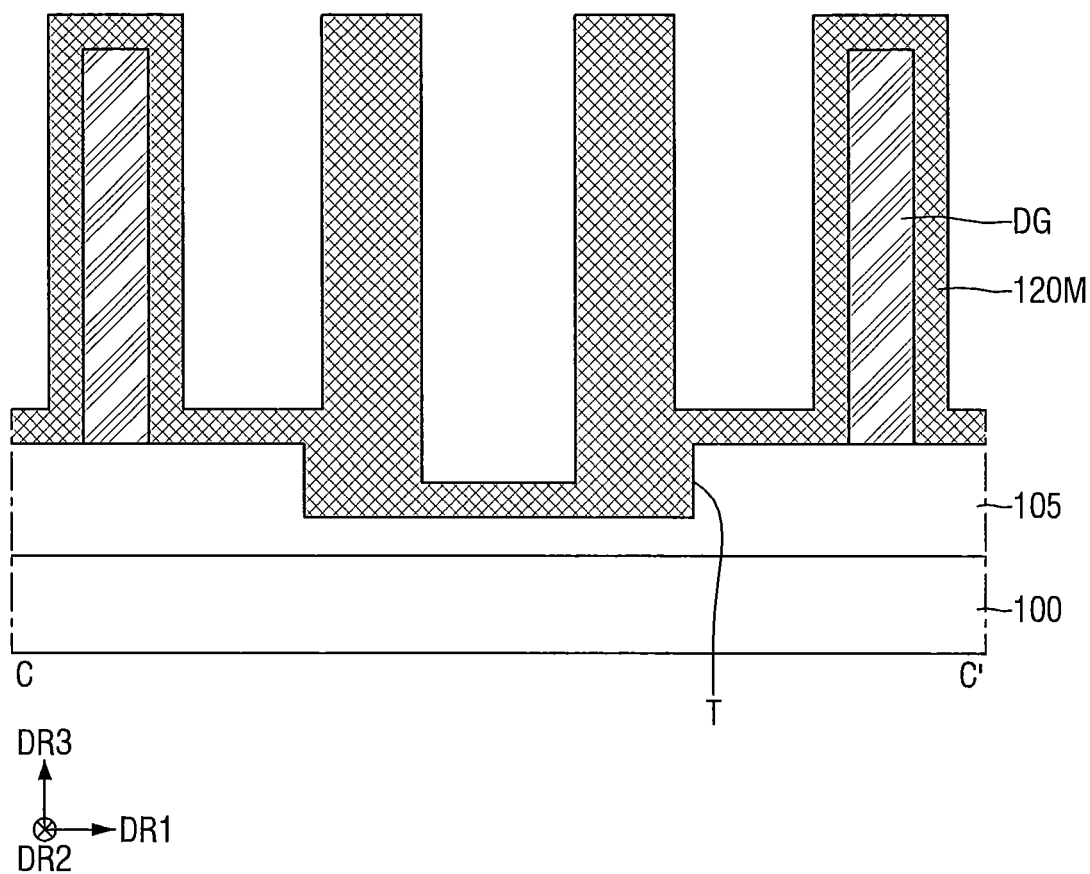
Figure 30:
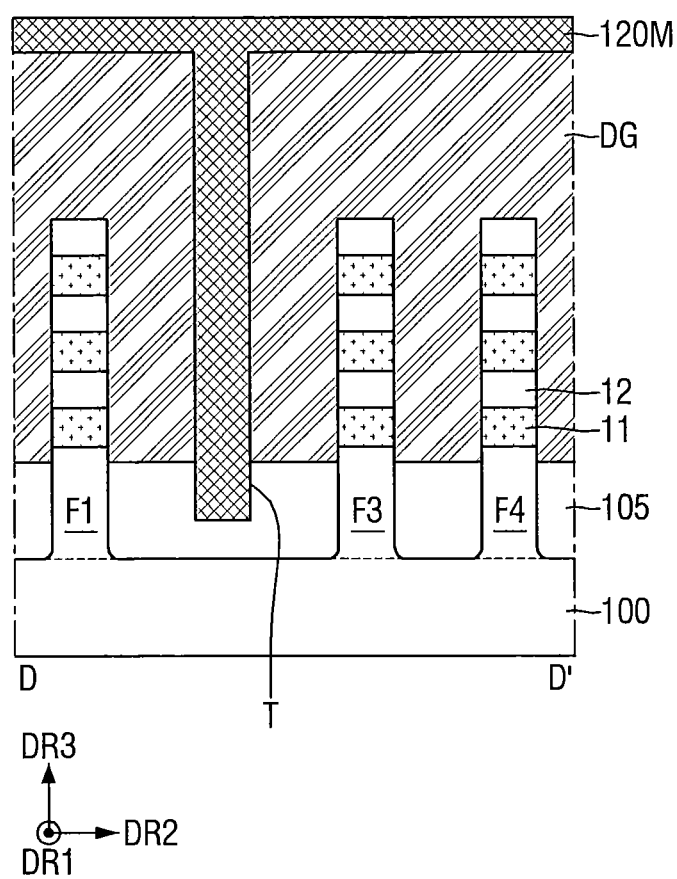

Referring to FIG. 28 to FIG. 30, a spacer material layer 120M may be formed along an upper surface of the second semiconductor layer 12. The spacer material layer 120M may also be at partially on a sidewall and an upper surface of each of the plurality of dummy gates DG, an upper surface of the field insulating layer 105, and a bottom surface of the trench T. For example, the spacer material layer 120M may be conformally formed thereon.

In FIG. 30, the spacer material layer 120M may be on, and conform to, the sidewalls of the plurality of dummy gates DG and the trench T. Thus, as shown in FIG. 29, the spacer material layer 120M may be formed on the trench T so as to extend in the vertical direction DR3.

When conforming the spacer material layer 120M to the sidewalls of the plurality of dummy gates DG, each of opposing sidewalls GC1_S1 and GC1_S2 in the first horizontal direction DR1 of the first gate cut (GC1 in FIG. 2) may be concave toward the center of the first gate cut as shown in FIG. 2.

Figure 31:
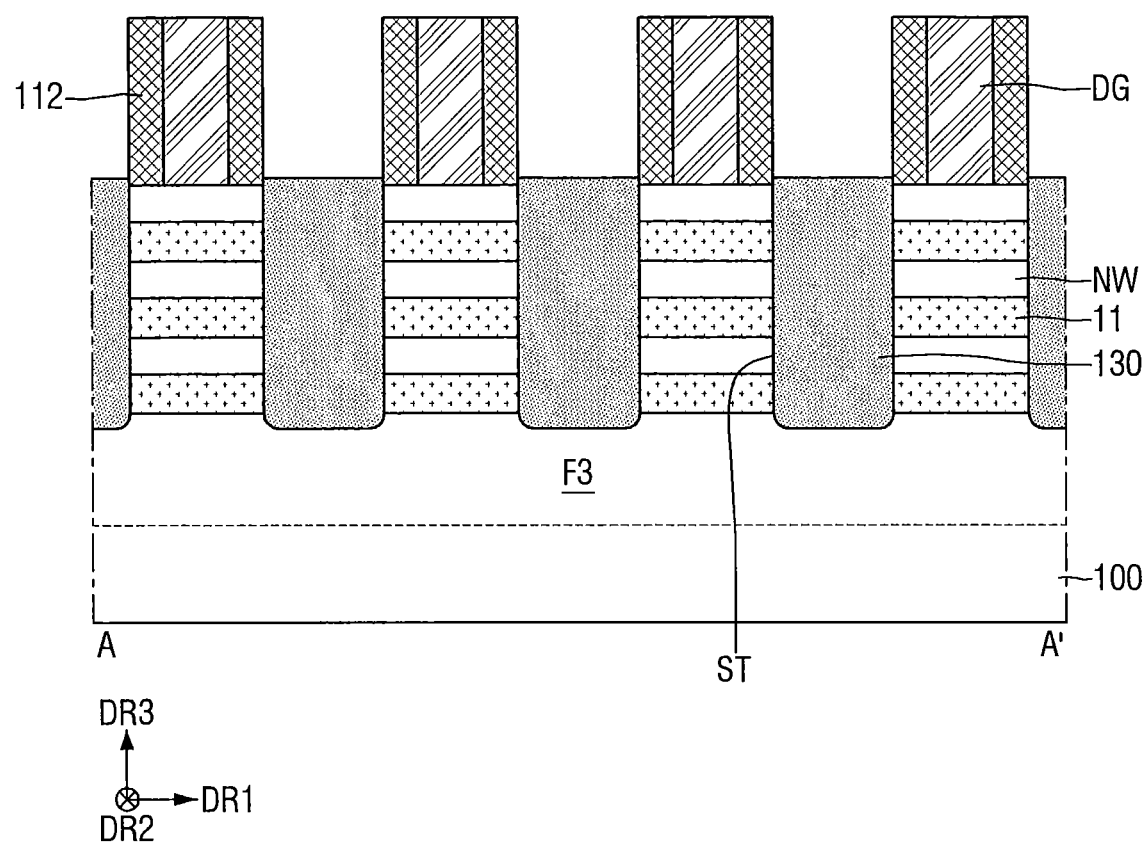

Referring to FIG. 31, the source/drain trench ST may be formed by etching the first semiconductor layer 11 and the second semiconductor layer 12 using the plurality of dummy gates DG as a mask. During the etching process, the spacer material layer 120M formed on the upper surfaces of the plurality of dummy gates DG and the second semiconductor layer 12 may be etched.

The gate spacer 112 may be formed on the sidewalls of the plurality of dummy gates DG via the etching process. Further, the etched second semiconductor layer 12 may be defined by the plurality of nanosheets NW. For example, a portion of the third active pattern F3 may be etched via the etching process.

Subsequently, the source/drain region 130 may be formed in the source/drain trench ST. For example, a vertical level of an upper surface of the source/drain region 130 may be higher than that of an upper surface of the uppermost nanosheet of the plurality of nanosheets NW. However, the present disclosure is not limited thereto.

Figure 32:
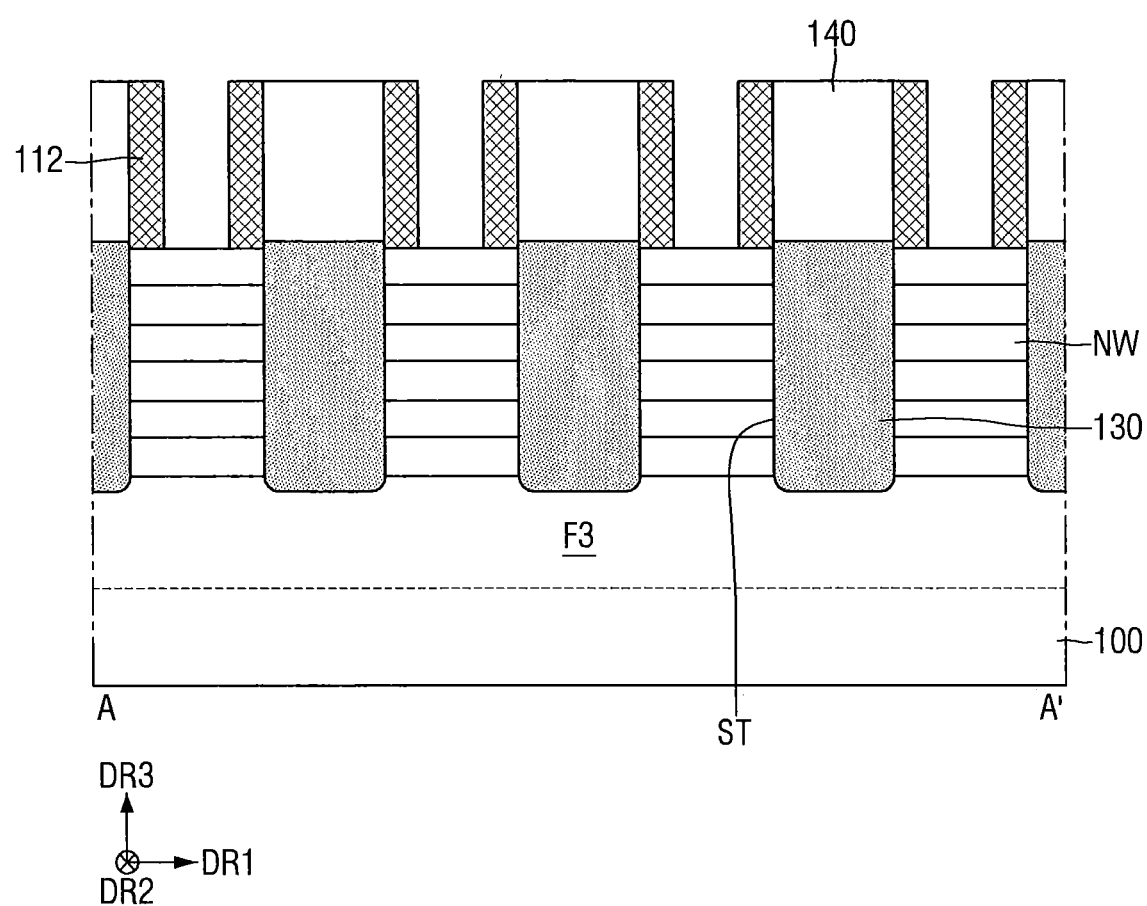
Figure 33:
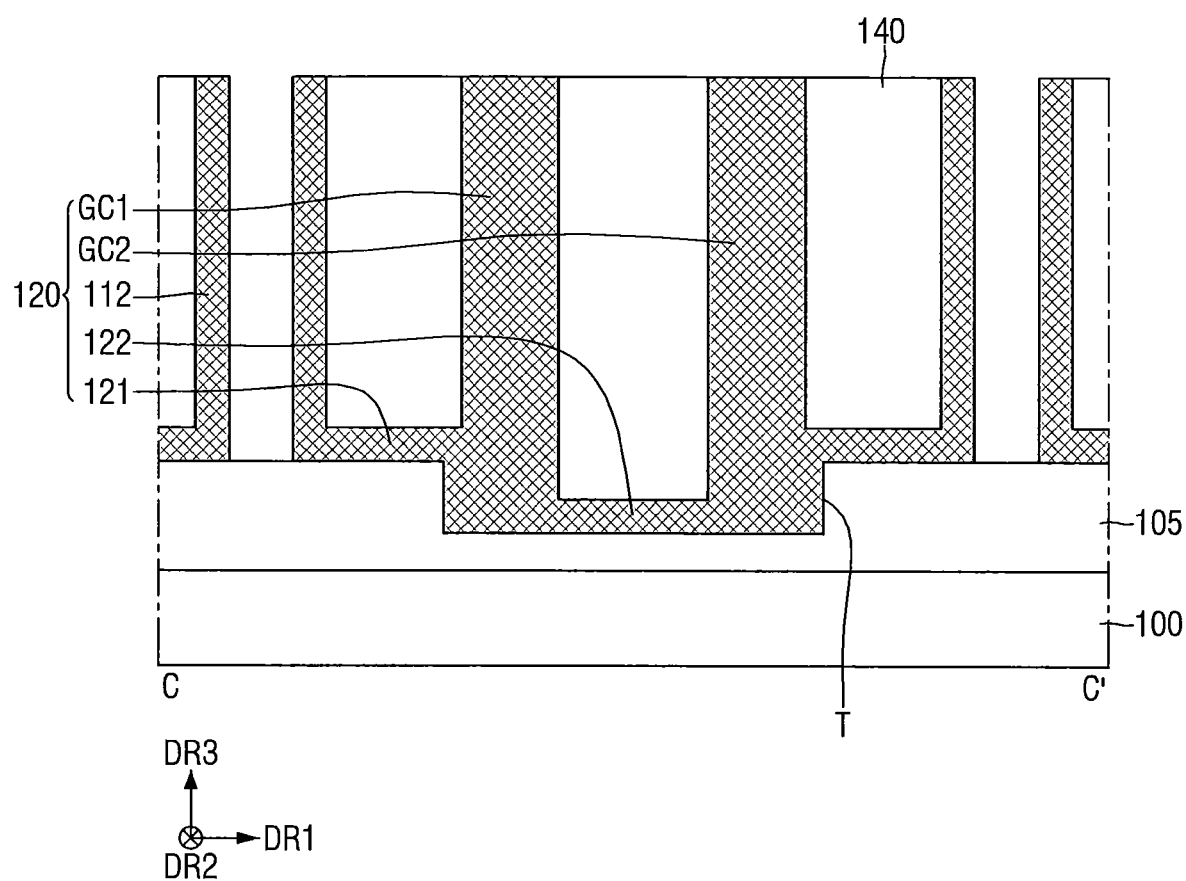
Figure 34:
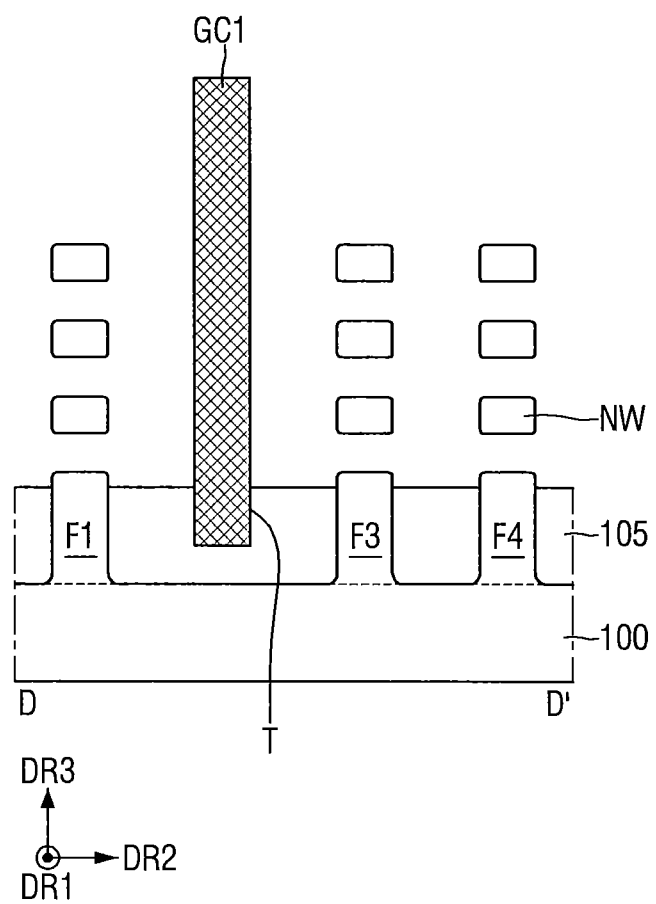

Referring to FIG. 32 to FIG. 34, the first interlayer insulating layer 140 may be formed to at least partially cover the spacer material layer (120M in FIG. 29), the source/drain region 130, the gate spacer 112, and the plurality of dummy gates DG.

Then, an upper surface of each of the plurality of dummy gates DG may be exposed using a planarization process. Subsequently, the plurality of dummy gates DG and the first semiconductor layer (11 in FIG. 31) may be removed. Using this planarization process, the spacer 120 including the gate spacer 112, the first gate cut GC1, the second gate cut GC2, the first connective portion 121 and the second connective portion 122 may be defined (see, e.g., FIG. 13).

Figure 35:
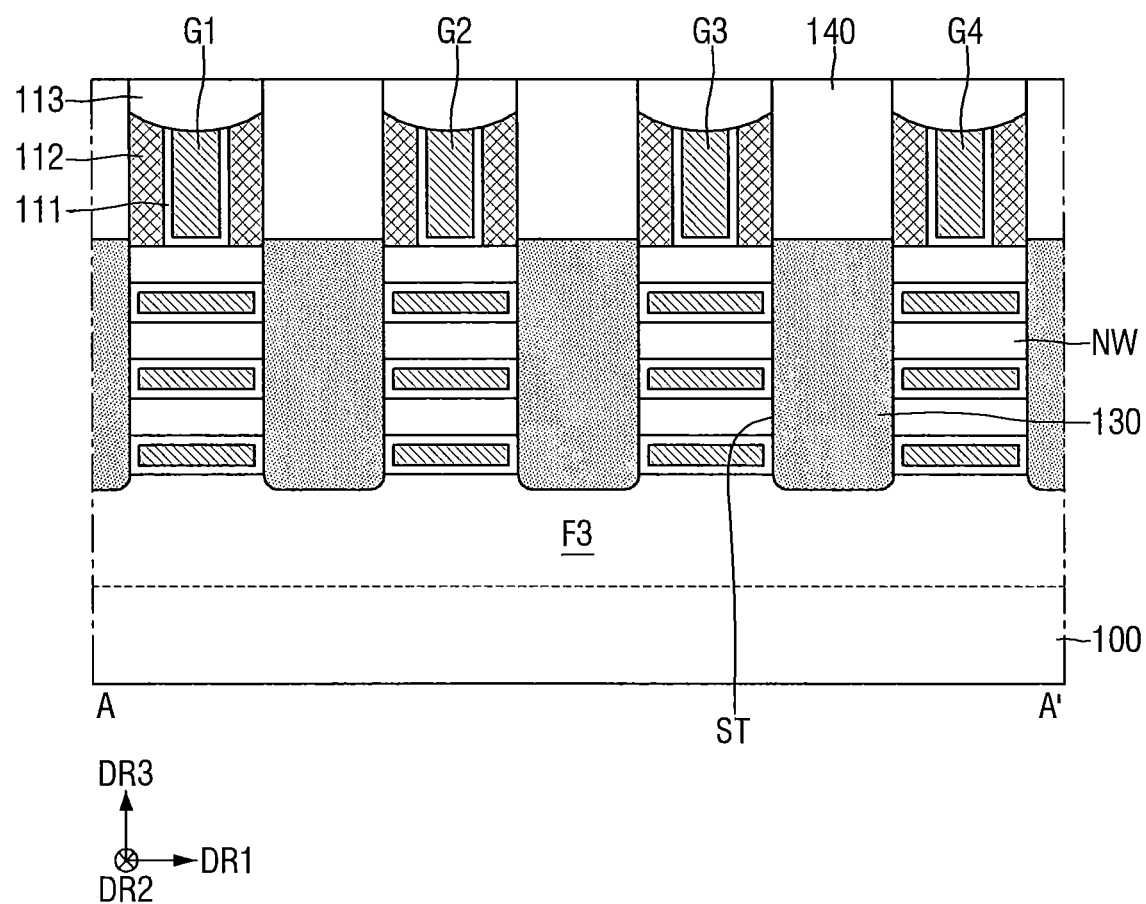
Figure 36:
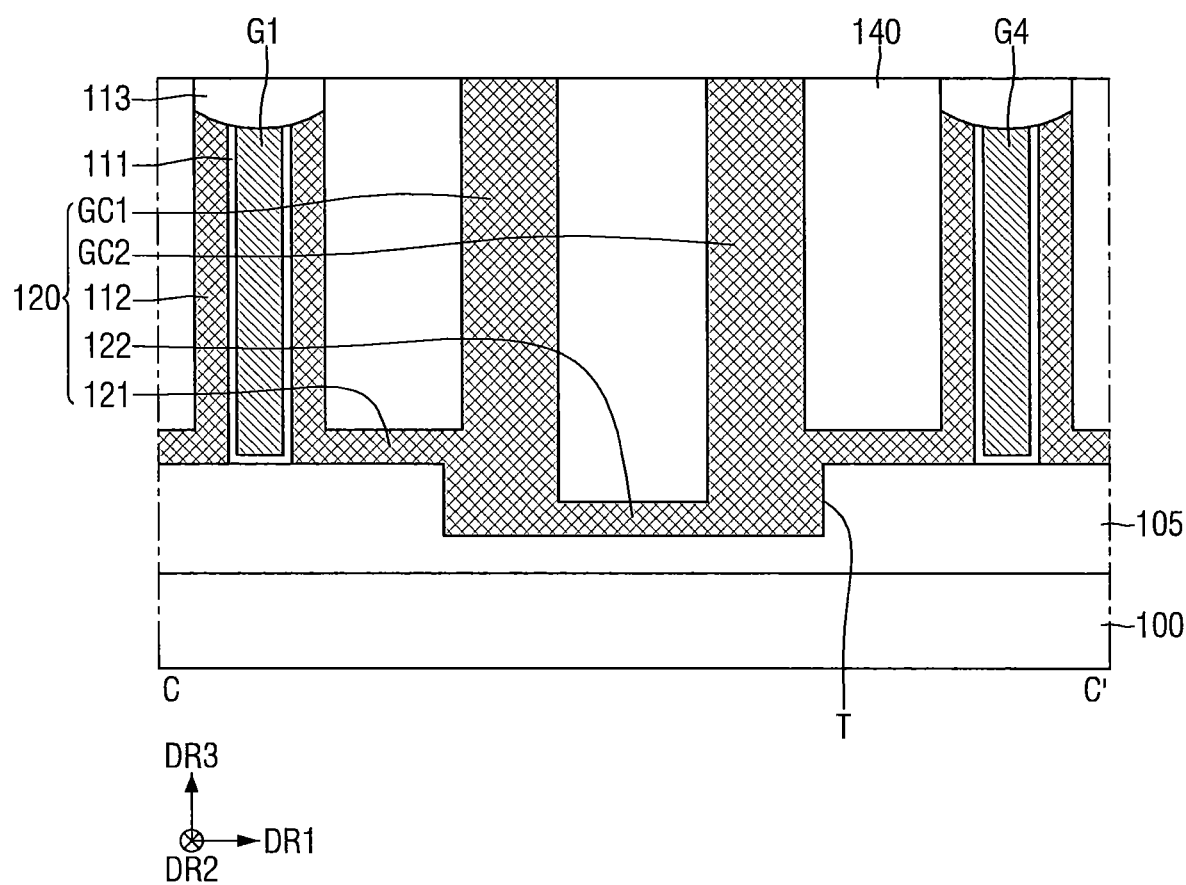
Figure 37:
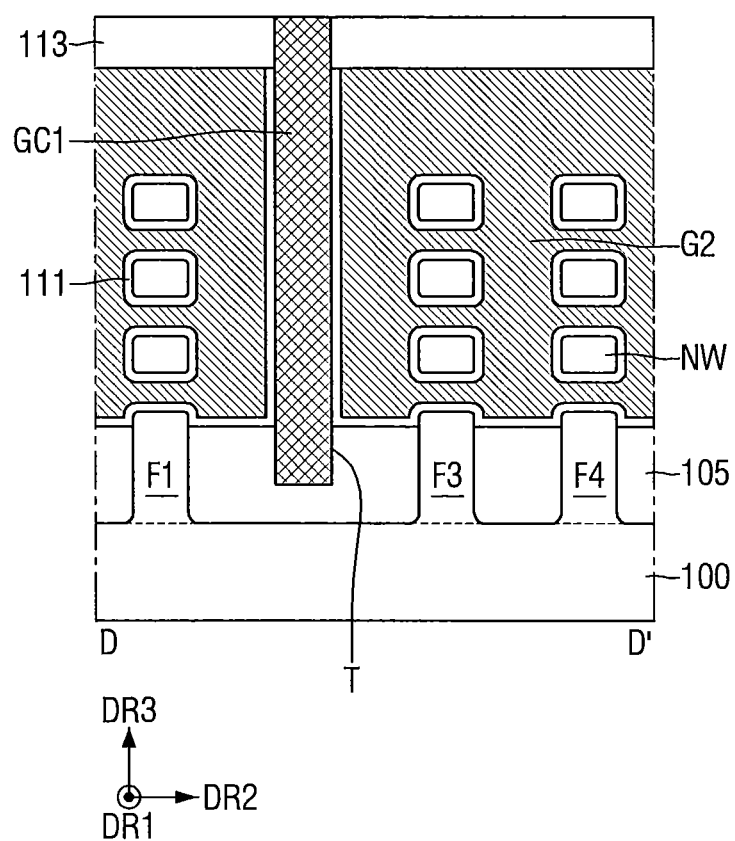

Referring to FIG. 35 to FIG. 37, the gate insulating layer 111, the first to fourth gate electrodes G1, G2, G3, and G4, and the capping pattern 113 may be formed in locations where the plurality of dummy gates DG and the first semiconductor layer (11 in FIG. 31) are removed.

Referring to FIG. 1 to FIG. 6, the gate contact 180 extending through the capping pattern 113 in the vertical direction DR3 and connecting to the second gate electrode G2 may be formed. Further, the source/drain contact 150 extending through the first interlayer insulating layer 140 in the vertical direction DR3 and connecting to the source/drain region 130 may be formed. The silicide layer 155 may be formed between the source/drain region 130 and the source/drain contact 150.

Subsequently, the etch stop layer 160 and the second interlayer insulating layer 170 may be sequentially formed on the first interlayer insulating layer 140. Subsequently, the first via 191 extending through the second interlayer insulating layer 170 and the etch stop layer 160 in the vertical direction DR3 and connecting to the source/drain contact 150 may be formed. Further, the second via 192 extending through the second interlayer insulating layer 170 and the etch stop layer 160 in the vertical direction DR3 and connecting to the gate contact 180 may be formed.

The method for manufacturing a semiconductor device according to some embodiments of the present disclosure includes forming the gate cuts GC1 and GC2 after the plurality of dummy gates DG has been formed, and in some cases substantially immediately after the dummy gates DG have been formed. Thus, the interlayer insulating layer 140 may be prevented from being lost in the process of forming the gate cuts GC1 and GC2, thereby improving the reliability of the semiconductor device.

In the semiconductor device according to some embodiments of the present disclosure manufactured through the manufacturing method, each of both opposing sidewalls in the first horizontal direction DR1 of the first gate cut (GC1 in FIG. 2) may be concave toward the center of the first gate cut (GC1 in FIG. 2). Further, in the semiconductor device according to some embodiments of the present disclosure manufactured through the manufacturing method, the gate spacer 112, the first gate cut GC1 and the second gate cut GC2 may be integrally formed into a single monolithic structure.

Hereinafter, a semiconductor device according to some embodiments of the present disclosure will be described with reference to FIG. 38 to FIG. 40. Following descriptions are based on differences thereof from the above descriptions of the semiconductor device shown in FIG. 1 to FIG. 6.

Figure 38:
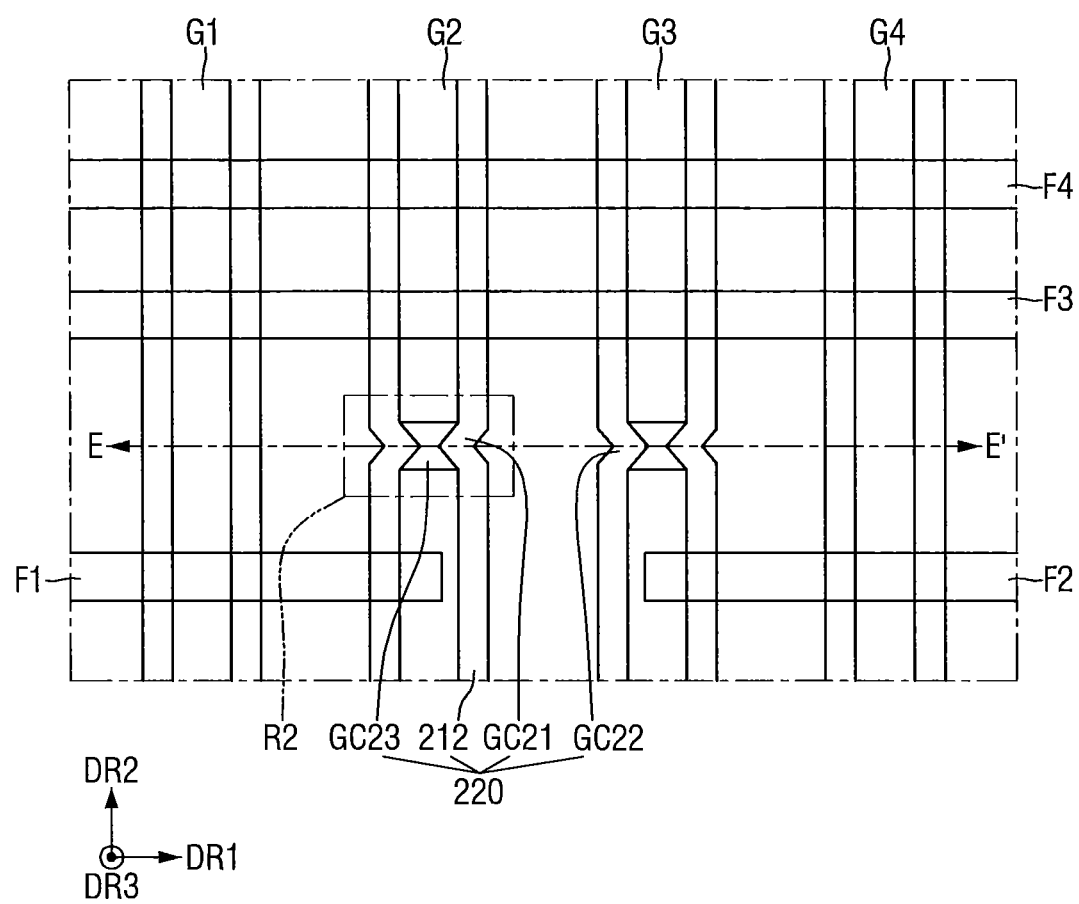
FIG. 38 is a layout diagram for illustrating a semiconductor device according to further embodiments of the present disclosure.

FIG. 38 is a layout diagram for illustrating a semiconductor device according to some further embodiments of the present disclosure. FIG. 39 is an enlarged view of a R2 region of FIG. 38. FIG. 40 is a cross-sectional view taken along a line E-E' in FIG. 38.

Figure 39:
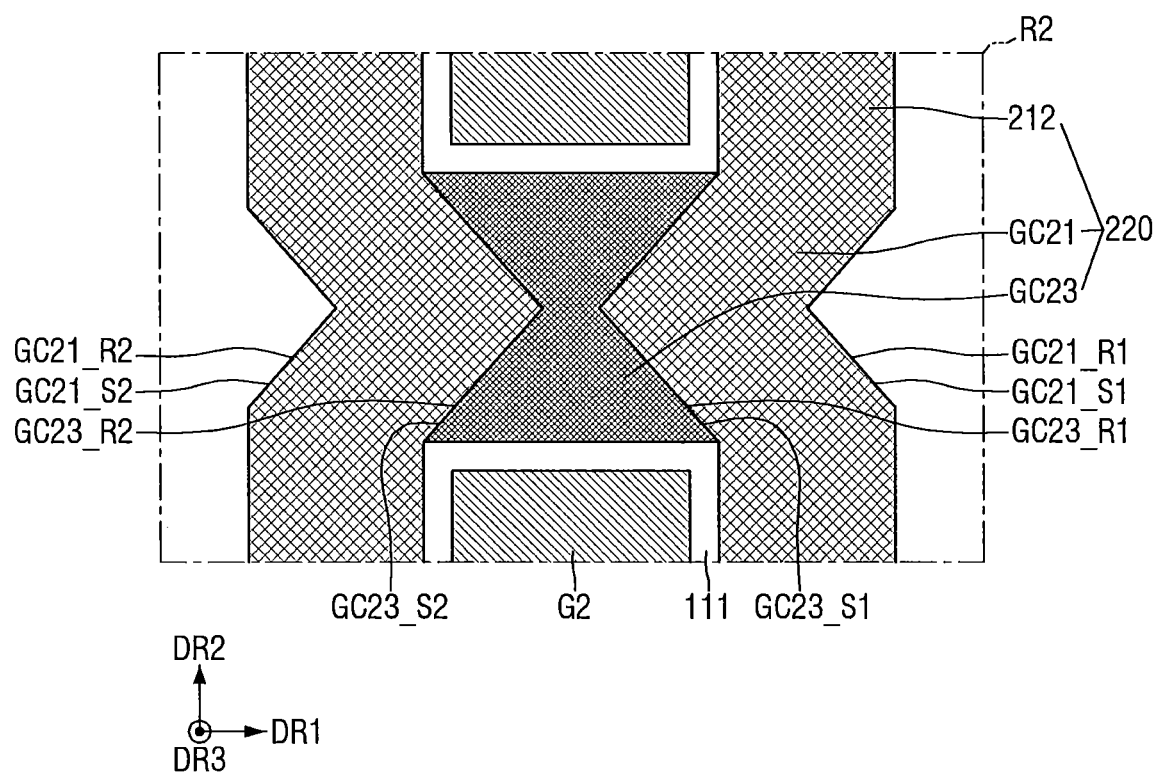
FIG. 39 is an enlarged view of a R2 region of FIG. 38.
Figure 40:
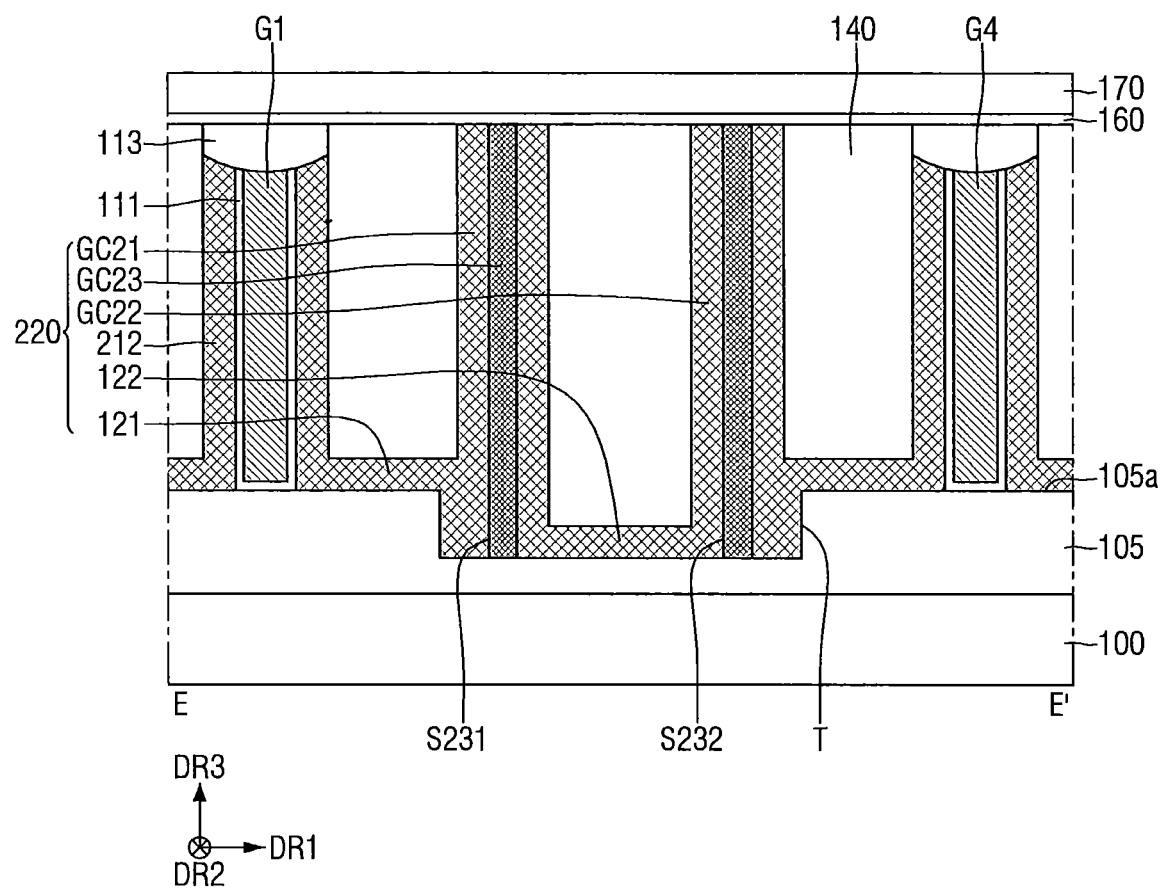
FIG. 40 is a cross-sectional view taken along a line E-E' in FIG. 38.

Referring to FIG. 38 to FIG. 40, in the semiconductor device according to some embodiments of the present disclosure, a spacer 220 may include a gate spacer 212, a first gate cut GC21, a second gate cut GC22, a third gate cut GC23, a first connective portion 121 and a second connective portion 122.

Each third gate cut GC23 may be disposed in each of the first gate cut GC21 and the second gate cut GC22. A sidewall S231 of one third gate cut GC23 may be surrounded with the first gate cut GC21. Further, the sidewall S232 of another third gate cut GC23 may be surrounded with the second gate cut GC22.

For example, both opposing sidewalls GC21_S1 and GC21_S2 in the first horizontal direction DR1 of the first gate cut GC21 may be concave toward a center of the first gate cut GC21. Specifically, the first gate cut GC21 may include a first recess GC21_R1 formed on a first side and a second recess GC21_R2 formed on a second side opposite to the first side in the first horizontal direction DR1. Each of the first recess GC21_R1 and the second recess GC21_R2 may be concave toward the center of the first gate cut GC21.

Both opposing sidewalls GC23_S1 and GC23_S2 in the first horizontal direction DR1 of the third gate cut GC23 may be concave toward the center of the first gate cut GC21. Specifically, the third gate cut GC23 may include a third recess GC23_R1 formed on a first side thereof and a fourth recess GC23_R2 formed on a second side thereof opposite to the first side in the first horizontal direction DR1. Each of the third recess GC23_R1 and the fourth recess GC23_R2 may be concave toward the center of the first gate cut GC21.

At least a portion of the third gate cut GC23 may be in the trench T. A bottom surface of the third gate cut GC23 may be coplanar with a bottom surface of the first gate cut GC21 and a bottom surface of the second gate cut GC22. In some embodiments, a bottom surface of the third gate cut GC23 may be at a level lower than a level of one or both of a bottom surface of the first gate cut GC21 and a bottom surface of the second gate cut GC22. An upper surface of the third gate cut GC23 may be coplanar with an upper surface of the first gate cut GC21 and an upper surface of the second gate cut GC22.

The third gate cut GC23 may include a different material from that of each of the first gate cut GC21 and the second gate cut GC22. The third gate cut GC23 may include, for example, at least one of silicon nitride (SiN), silicon carbonitride (SiCN) and silicon oxynitride (SiOCN).

Hereinafter, a semiconductor device according to still further some embodiments of the present disclosure will be described with reference to FIG. 41. Following descriptions are based on differences thereof from the above descriptions of the semiconductor device shown in FIG. 38 to FIG. 40.

Figure 41:
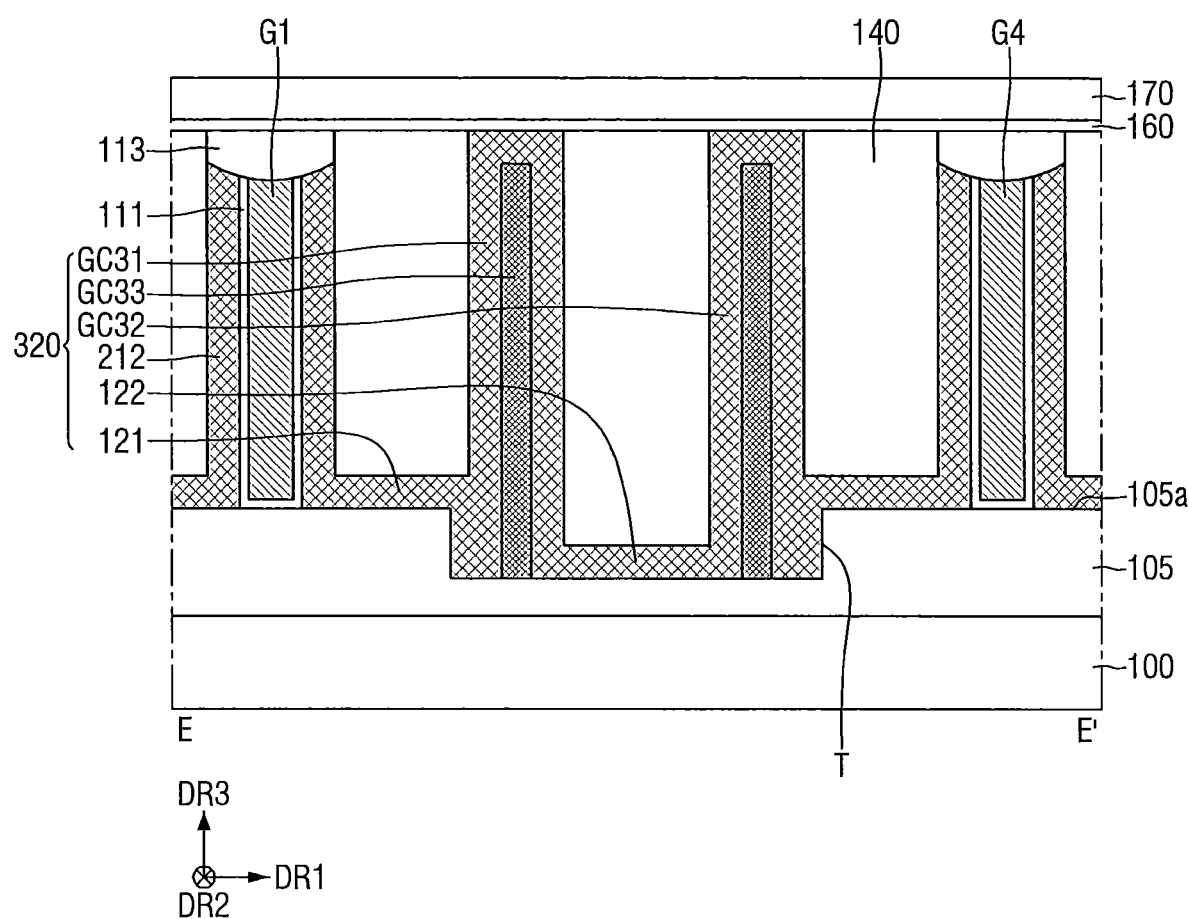
FIG. 41 is a cross-sectional view for illustrating a semiconductor device according to still further embodiments of the present disclosure.

FIG. 41 is a cross-sectional view for illustrating a semiconductor device according to still further some embodiments of the present disclosure.

Referring to FIG. 41, in the semiconductor device according to still further some embodiments of the present disclosure, a spacer 320 may include the gate spacer 212, a first gate cut GC31, a second gate cut GC32, a third gate cut GC33, the first connective portion 121 and the second connective portion 122.

A vertical level of an upper surface of the third gate cut GC33 may be lower than that of an upper surface of each of the first gate cut GC31 and an upper surface of the second gate cut GC32. The first gate cut GC31 may be on and cover at least a portion of an upper surface of the third gate cut GC33 inside the first gate cut GC31. Further, the second gate cut GC32 may be on and cover at least a portion of an upper surface of the third gate cut GC33 inside the second gate cut GC32.

Hereinafter, a semiconductor device according to still further some embodiments of the present disclosure will be described with reference to FIG. 42 to FIG. 45. Following descriptions are based on differences thereof from the above descriptions of the semiconductor device shown in FIG. 1 to FIG. 6.

Figure 42:
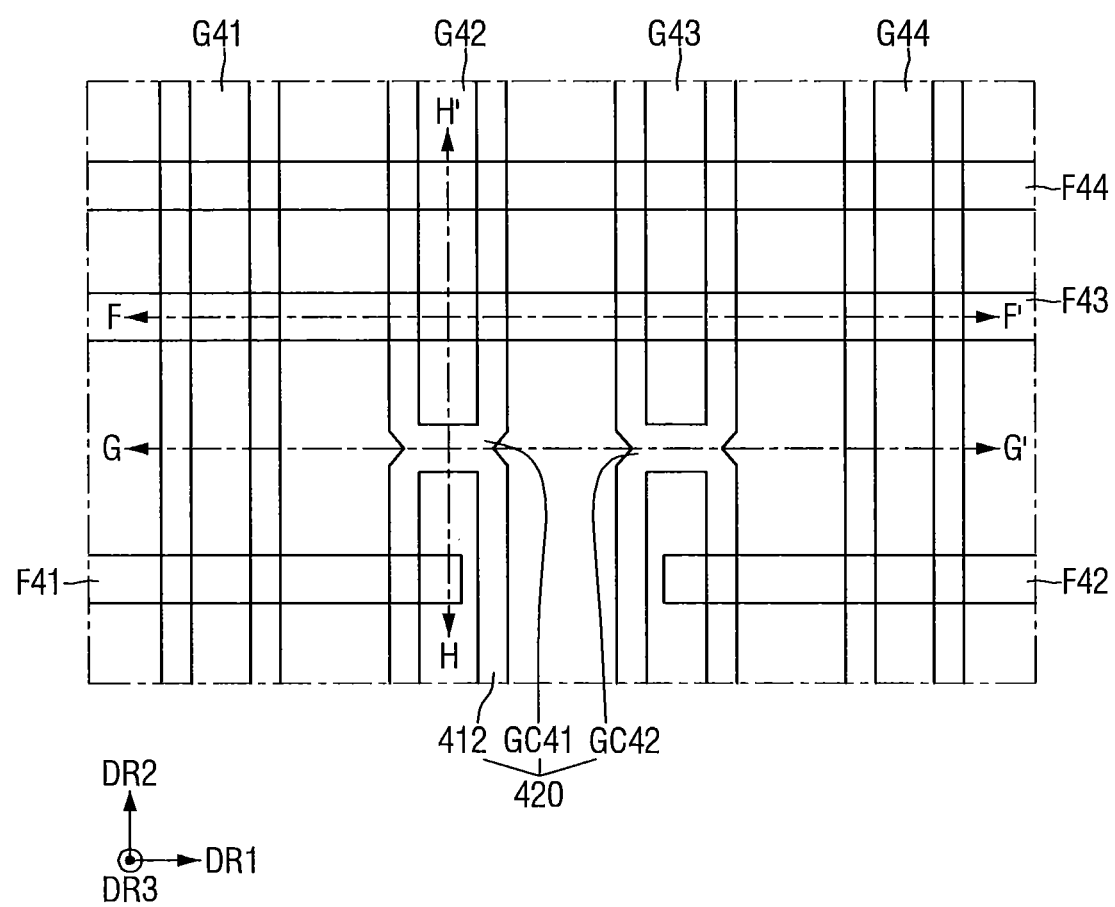
FIG. 42 is a layout diagram for illustrating a semiconductor device according to still further embodiments of the present disclosure.
Figure 43:
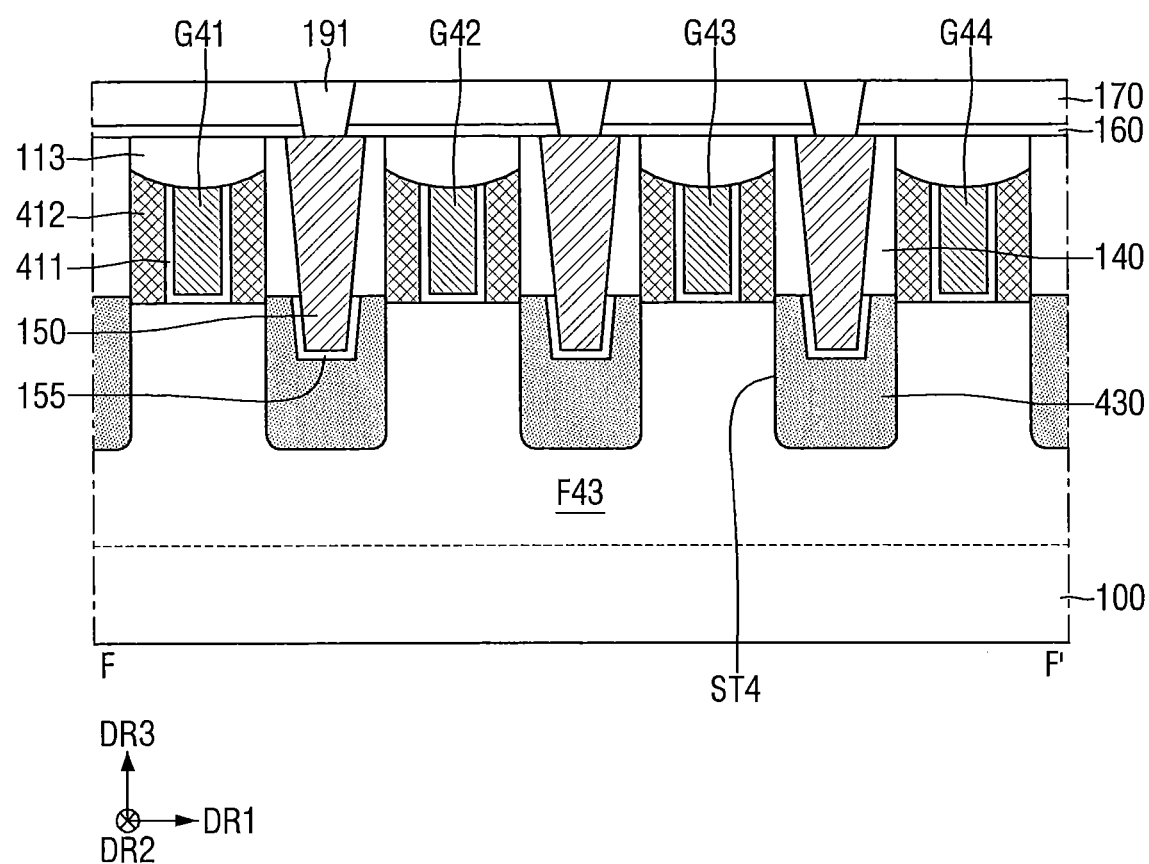
FIG. 43 is a cross-sectional view taken along a line F-F' of FIG. 42.
Figure 44:
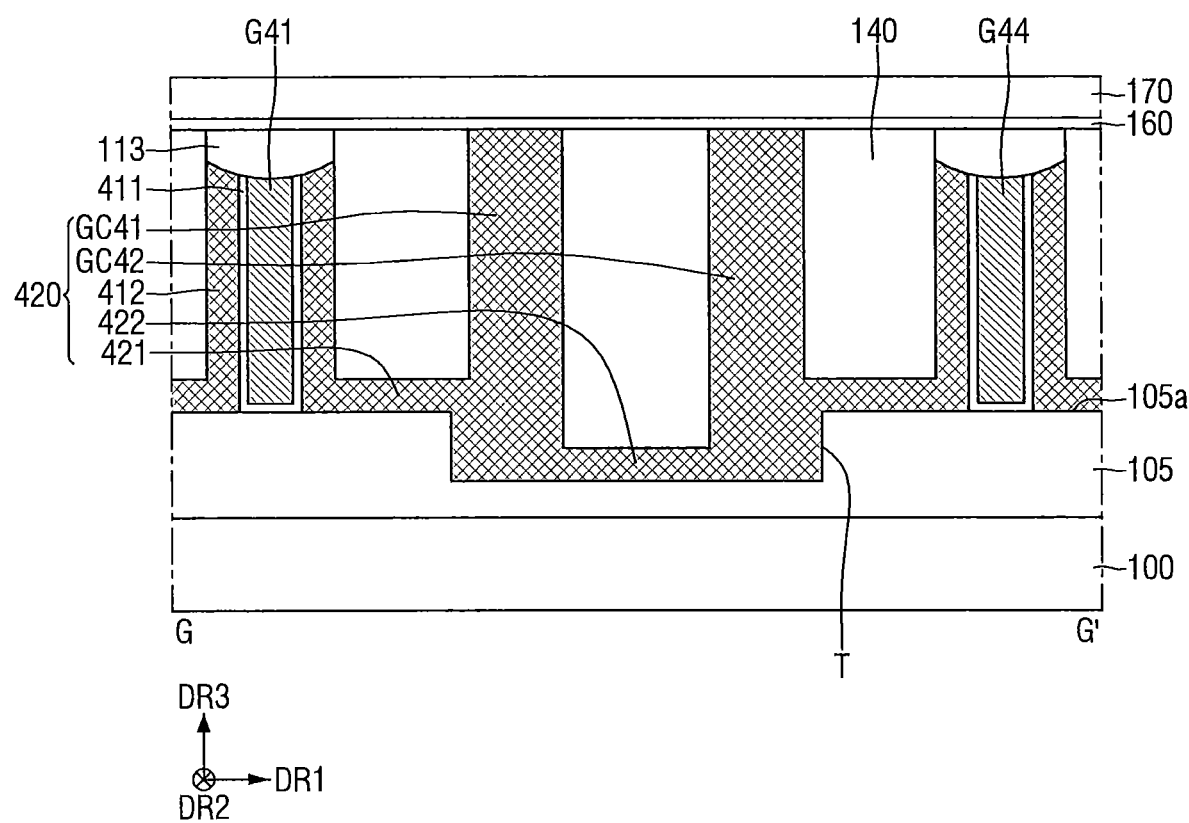
FIG. 44 is a cross-sectional view taken along a line G-G' in FIG. 42.
Figure 45:
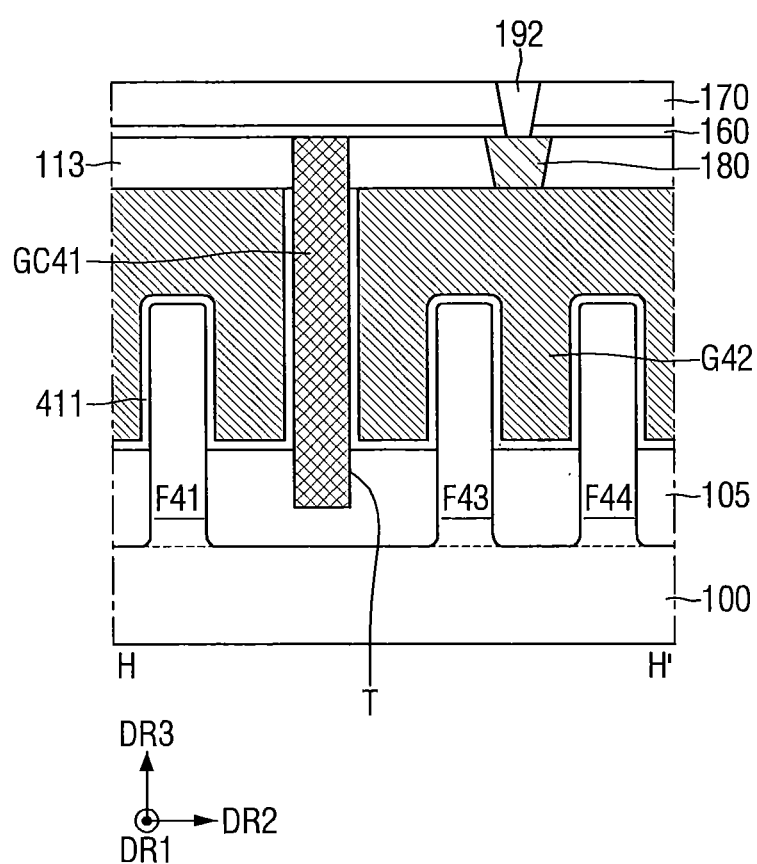
FIG. 45 is a cross-sectional view taken along a line H-H' in FIG. 42.

FIG. 42 is a layout diagram for illustrating a semiconductor device according to still further some embodiments of the present disclosure. FIG. 43 is a cross-sectional view taken along a line F-F' of FIG. 42. FIG. 44 is a cross-sectional view taken along a line G-G' in FIG. 42. FIG. 45 is a cross-sectional view taken along a line H-H' in FIG. 42.

Referring to FIG. 42 to FIG. 45, the semiconductor device according to still further some embodiments of the present disclosure may include a pin-like transistor FinFET. For example, the semiconductor device according to still further some embodiments of the present disclosure may include the substrate 100, first to fourth active patterns F41, F42, F43, and F44, the field insulating layer 105, first to fourth gate electrodes G41, G42, G43, and G44, the gate insulating layer 411, a capping pattern 413, a spacer 420, a source/drain region 430, the first interlayer insulating layer 140, the source/drain contact 150, the silicide layer 155, the etch stop layer 160, the second interlayer insulating layer 170, the gate contact 180, the first via 191 and the second via 192.

Each of the first to fourth active patterns F41, F42, F43, and F44 may protrude from the substrate 100 in the vertical direction DR3. Each of the first to fourth active patterns F41, F42, F43, and F44 may extend in the first horizontal direction DR1. The second active pattern F42 may be spaced apart from the first active pattern F41 in the first horizontal direction DR1. The third active pattern F43 may be spaced apart from each of the first active pattern F41 and the second active pattern F42 in the second horizontal direction DR2. The fourth active pattern F44 may be spaced apart from the third active pattern F43 in the second horizontal direction DR2.

Each of the first gate electrode G41 and the second gate electrode G42 may extend in the second horizontal direction DR2 and be on the field insulating layer 105, the first active pattern F41, the third active pattern F43, and the fourth active pattern F44. The second gate electrode G42 may be spaced apart from the first gate electrode G41 in the first horizontal direction DR1.

Each of the third gate electrode G43 and the fourth gate electrode G44 may extend in the second horizontal direction DR2 and may be on the field insulating layer 105, the second active pattern F42, the third active pattern F43, and the fourth active pattern F44. The third gate electrode G43 may be spaced apart from the second gate electrode G42 in the first horizontal direction DR1. The fourth gate electrode G44 may be spaced apart from the third gate electrode G43 in the first horizontal direction DR1.

The spacer 420 may include a gate spacer 412, a first gate cut GC41, a second gate cut GC42, a first connective portion 421 and a second connective portion 422. The gate spacer 412, the first gate cut GC41, the second gate cut GC42, the first connective portion 421 and the second connective portion 422 may have structures similar to those of the gate spacer 112, the first gate cut GC1, the second gate cut GC2, the first connective portion 121 and the second connective portion 122 as shown in FIG. 1 to FIG. 6, respectively.

The gate insulating layer 411 may be between each of the first to fourth gate electrodes G41, G42, G43, and G44 and the gate spacer 412. The gate insulating layer 411 may be between each of the first to fourth gate electrodes G41, G42, G43, and G44 and each of the first to fourth active patterns F41, F42, F43, and F44. The gate insulating layer 411 may be disposed each of the first to fourth gate electrodes G41, G42, G43, and G44 and the field insulating layer 105.

The source/drain region 430 may be on each of the first to fourth active patterns F41, F42, F43, and F44 and at least partially inside a source/drain trench ST4 formed on at least one side of each of the first to fourth gate electrodes G41, G42, G43, and G44.

Hereinafter, a semiconductor device according to still further some embodiments of the present disclosure will be described with reference to FIG. 46. Following descriptions are based on differences thereof from the above descriptions of the semiconductor device shown in FIG. 1 to FIG. 6.

Figure 46:
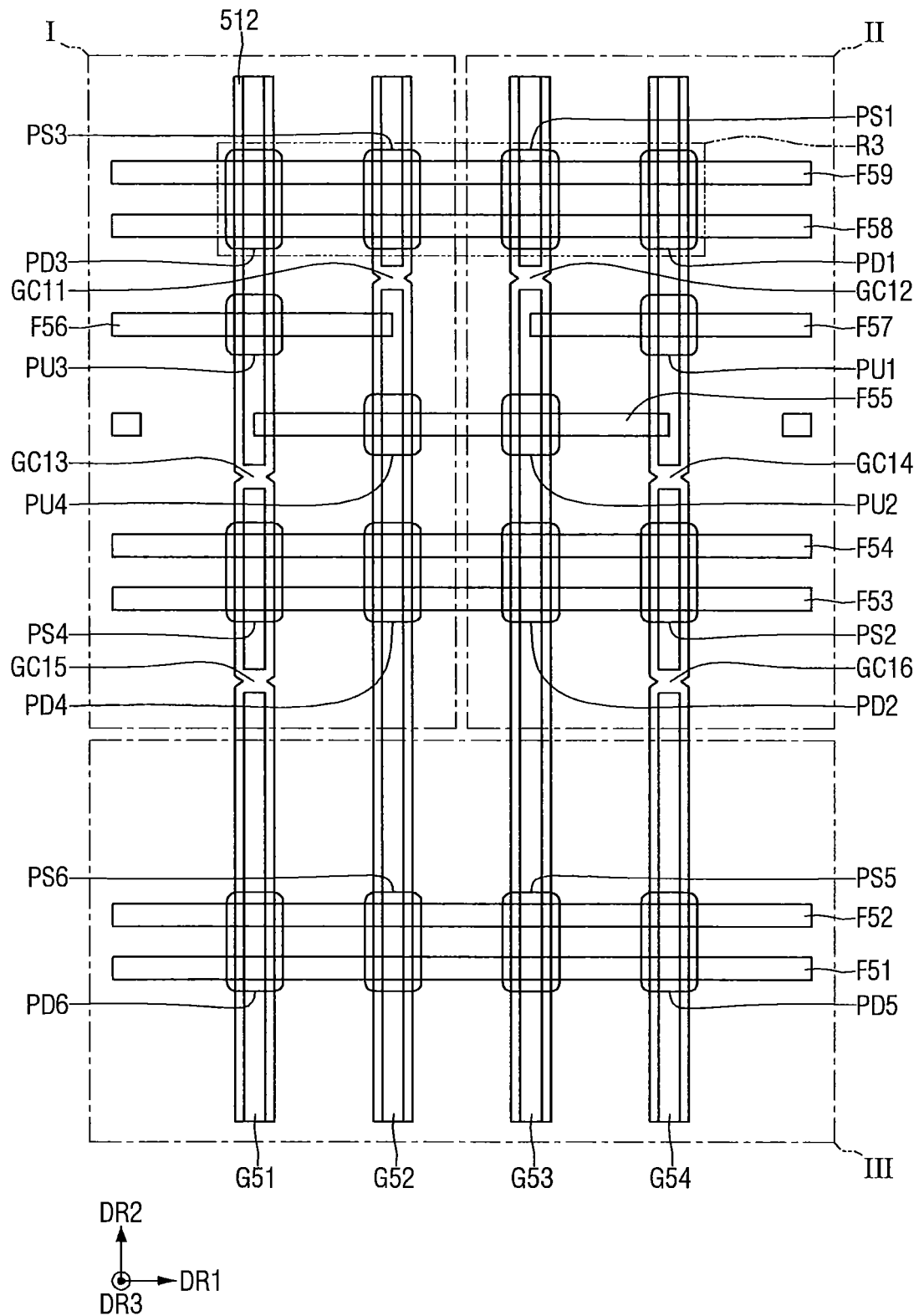
FIG. 46 is a layout diagram for illustrating a semiconductor device according to still further embodiments of the present disclosure.

FIG. 46 is a layout diagram for illustrating a semiconductor device according to still further some embodiments of the present disclosure.

Referring to FIG. 46, the semiconductor device according to still further some embodiments of the present disclosure may include first to ninth active patterns F51 to F59, first to fourth gate electrodes G51, G52, G53, and G54, first to sixth gate cuts GC11 to GC16, and a gate spacer 512.

Each of a first cell region I and a second cell region II may act as a storage region. That is, a storage device may be formed in each of the first cell region I and the second cell region II. In this case, the storage device may be embodied as a SRAM (static random access memory). In a comparison region III, a comparator for comparing signals of the first cell region I and the second cell region II with each other may be formed. That is, the semiconductor device according to still further some embodiments of the present disclosure may constitute a TCAM (Ternary Content-Addressable Memory) cell.

The second cell region II may be disposed adjacent to the first cell region I in the first horizontal direction DR1. The comparison region III may be disposed adjacent to each of the first cell region I and the second cell region II in the second horizontal direction DR2.

Each of the first active pattern F51 and the second active pattern F52 may extend in the first horizontal direction DR1 and may be disposed in the comparison region III. The second active pattern F52 may be spaced apart from the first active pattern F51 in the second horizontal direction DR2.

Each of the third to fifth active patterns F53, F54, and F55 may extend in the first horizontal direction DR1 and across both the first cell region I and the second cell region II. The third active pattern F53 may be spaced apart from the second active pattern F52 in the second horizontal direction DR2. The fourth active pattern F54 may be spaced apart from the third active pattern F53 in the second horizontal direction DR2. The fifth active pattern F55 may be spaced apart from the fourth active pattern F54 in the second horizontal direction DR2.

The sixth active pattern F56 may be disposed in the first cell region I and extend in the first horizontal direction DR1. The sixth active pattern F56 may be spaced apart from the fifth active pattern F55 in the second horizontal direction DR2. The seventh active pattern F57 may be disposed in the second cell region II and extend in the first horizontal direction DR1. The seventh active pattern F57 may be spaced apart from the fifth active pattern F55 in the second horizontal direction DR2. The seventh active pattern F57 may be spaced apart from the sixth active pattern F56 in the first horizontal direction DR1.

Each of the eighth active pattern F58 and the ninth active pattern F59 may extend in the first horizontal direction DR1 and across both the first cell region I and the second cell region II. The eighth active pattern F58 may be spaced apart from each of the sixth active pattern F56 and the seventh active pattern F57 in the second horizontal direction DR2. The ninth active pattern F59 may be spaced apart from the eighth active pattern F58 in the second horizontal direction DR2.

Each of the first gate electrode G51 and the second gate electrode G52 may extend in the second horizontal direction DR2 and across both the comparison region III and the first cell region I. The second gate electrode G52 may be spaced apart from the first gate electrode G51 in the first horizontal direction DR1. Each of the first gate electrode G51 and the second gate electrode G52 may intersect each of the first to sixth active patterns F51 to F56 and the eighth and ninth active patterns F58 and F59.

Each of the third gate electrode G53 and the fourth gate electrode G54 may extend in the second horizontal direction DR2 and across both the comparison region III and the second cell region II. The third gate electrode G53 may be spaced apart from the second gate electrode G52 in the first horizontal direction DR1. The fourth gate electrode G54 may be spaced apart from the third gate electrode G53 in the first horizontal direction DR1. Each of the third gate electrode G53 and the fourth gate electrode G54 may intersect each of the first to fifth active patterns F51 to F55 and the seventh to ninth active patterns F57 to F59.

The gate spacer 512 may extend in the second horizontal direction DR2 and be on both opposing sidewalls of each of the first to fourth gate electrodes G51, G52, G53, and G54.

The first gate cut GC11 may be between the sixth active pattern F56 and the eighth active pattern F58 and may divide the second gate electrode G52 into two portions spaced from each other in the second horizontal direction DR2. The second gate cut GC12 may be between the seventh active pattern F57 and the eighth active pattern F58 and may divide the third gate electrode G53 into two portions spaced from each other in the second horizontal direction DR2.

The third gate cut GC13 may be between the fourth active pattern F54 and the fifth active pattern F55 and may divide the first gate electrode G51 into two portions spaced from each other in the second horizontal direction DR2. The fourth gate cut GC14 may be between the fourth active pattern F54 and the fifth active pattern F55 and divide the fourth gate electrode G54 into two portions spaced from each other in the second horizontal direction DR2.

The fifth gate cut GC15 may be between the second active pattern F52 and the third active pattern F53 and divide the first gate electrode G51 into two portions spaced from each other in the second horizontal direction DR2. The fifth gate cut GC15 may be disposed in the first cell region I. The sixth gate cut GC16 may be between the second active pattern F52 and the third active pattern F53 and may divide the fourth gate electrode G54 into two portions spaced from each other in the second horizontal direction DR2. The sixth gate cut GC16 may be in the second cell region II.

Each of the first to sixth gate cuts GC11 to GC16 may have a structure similar to that of the first gate cut (GC1 in FIG. 1) shown in FIGS. 1 to 6. Further, the R3 region shown in FIG. 46 may be the same as FIG. 1.

The eighth and ninth active patterns F58 and F59 and the fourth gate electrode G54 may constitute a first pull-down transistor PD1. The seventh active pattern F57 and the fourth gate electrode G54 may constitute a first pull-up transistor PU1. The eighth and ninth active patterns F58 and F59 and the third gate electrode G53 may constitute a first pass transistor PS1. The third and fourth active patterns F53 and F54 and the third gate electrode G53 may constitute a second pull-down transistor PD2. The fifth active pattern F55 and the third gate electrode G53 may constitute a second pull-up transistor PU2. The third and fourth active patterns F53 and F54 and the fourth gate electrode G54 may constitute a second pass transistor PS2.

The eighth and ninth active patterns F58 and F59 and the first gate electrode G51 may constitute a third pull-down transistor PD3. The sixth active pattern F56 and the first gate electrode G51 may constitute a third pull-up transistor PU3. The eighth and ninth active patterns F58 and F59 and the second gate electrode G52 may constitute a third pass transistor PS3. The third and fourth active patterns F53 and F54 and the second gate electrode G52 may constitute a fourth pull-down transistor PD4. The fifth active pattern F55 and the second gate electrode G52 may constitute a fourth pull-up transistor PU4. The third and fourth active patterns F53 and F54 and the first gate electrode G51 may constitute a fourth pass transistor PS4.

The first and second active patterns F51 and F52 and the fourth gate electrode G54 may constitute a fifth pull-down transistor PD5. The first and second active patterns F51 and F52 and the third gate electrode G53 may constitute a fifth pass transistor PS5. The first and second active patterns F51 and F52 and the first gate electrode G51 may constitute a sixth pull-down transistor PD6. The first and second active patterns F51 and F52 and the second gate electrode G52 may constitute a sixth pass transistor PS6.

The embodiments according to the present disclosure have been described above with reference to the accompanying drawings. However, the present disclosure is not limited to the embodiments, but may be implemented in various different forms. The skilled person to the art will be able to understand that the present disclosure may be implemented in other specific forms without changing the technical spirit or essential characteristics of the present disclosure. Therefore, it should be understood that the embodiments described above are illustrative in all respects and not restrictive.

What is claimed is:

1. A semiconductor device comprising:
a substrate;
an active pattern on the substrate and extending in a first horizontal direction;
a first gate electrode on the active pattern and extending in a second horizontal direction different from the first horizontal direction;
a second gate electrode on the active pattern, the second gate electrode extending in the second horizontal direction and spaced apart from the first gate electrode in the first horizontal direction;
an interlayer insulating layer surrounding a sidewall of each of the first and second gate electrodes;
a gate spacer on opposing sidewalls of each of the first and second gate electrodes and extending in the second horizontal direction, the gate spacer comprising a first sidewall and a second sidewall opposite to the first sidewall in the first horizontal direction, wherein each of the first and second sidewalls is in contact with the interlayer insulating layer; and
a first gate cut dividing the second gate electrode into two portions spaced apart from each other in the second horizontal direction, wherein the first gate cut comprises a material that is the same as a material of the gate spacer,
wherein a first width of the first gate cut in the first horizontal direction is smaller than a second width of the gate spacer in the first horizontal direction.

2. The semiconductor device of claim 1, wherein the first gate cut has opposing sidewalls, and wherein each of the opposing sidewalls of the first gate cut has a recess that is concave toward a center of the first gate cut.

3. The semiconductor device of claim 1, further comprising a first connective portion for connecting the gate spacer on one sidewall of the first gate electrode to the first gate cut, wherein the first connective portion comprises a material that is the same as a material of each of the gate spacer and the first gate cut.

4. The semiconductor device of claim 3, further comprising a field insulating layer on the substrate and surrounding a sidewall of the active pattern, wherein the first connective portion is on at least a portion of an upper surface of the field insulating layer.

5. The semiconductor device of claim 1, further comprising:
a third gate electrode on the active pattern and extending in the second horizontal direction, wherein the third gate electrode is spaced apart from the second gate electrode in the first horizontal direction;
a second gate cut dividing the third gate electrode into two portions spaced apart from each other in the second horizontal direction, wherein the second gate cut comprises a material that is the same as a material of the gate spacer; and
a second connective portion connecting the first gate cut to the second gate cut, wherein the second connective portion comprises a material that is the same as a material of the gate spacer,
wherein the gate spacer, the first gate cut, and the second gate cut are integrally formed into a single monolithic structure.

6. The semiconductor device of claim 4, further comprising a trench recessed from the upper surface of the field insulating layer toward the substrate,
wherein at least a portion of the first gate cut is in the trench.

7. The semiconductor device of claim 4, further comprising a trench recessed from the upper surface of the field insulating layer toward the substrate, wherein the second connective portion is in the trench.

8. The semiconductor device of claim 7, wherein at least a portion of the interlayer insulating layer is on the second connective portion in the trench.

9. The semiconductor device of claim 1, further comprising a plurality of stacked nanosheets spaced apart from each other in a vertical direction on the active pattern,
wherein one or more of the plurality of stacked nanosheets is surrounded by the second gate electrode.

10. The semiconductor device of claim 1, further comprising a third gate cut having opposing sidewalls in the first horizontal direction thereof, wherein the opposing sidewalls of the third gate cut are surrounded by the first gate cut, and wherein each of the opposing sidewalls of the third gate cut has a recess that is concave toward a center of the first gate cut.

11. The semiconductor device of claim 10, wherein the third gate cut includes a material different from a material of the first gate cut.

12. The semiconductor device of claim 10, wherein the first gate cut covers an upper surface of the third gate cut.

13. A semiconductor device comprising:
a substrate;
an active pattern on the substrate and extending in a first horizontal direction;
a field insulating layer on the substrate and surrounding a sidewall of the active pattern;
a trench recessed from an upper surface of the field insulating layer toward the substrate;
a first gate electrode on the active pattern and extending in a second horizontal direction different from the first horizontal direction;
a second gate electrode on the active pattern, the second gate electrode extending in the second horizontal direction and spaced apart from the first gate electrode in the first horizontal direction;
an interlayer insulating layer surrounding a sidewall of each of the first and second gate electrodes;
a gate spacer on opposing sidewalls of each of the first and second gate electrodes and extending in the second horizontal direction;
a first gate cut dividing the second gate electrode into two portions spaced apart from each other in the second horizontal direction, wherein at least a portion of the first gate cut is in the trench, and wherein the first gate cut comprises a material that is the same as a material of the gate spacer; and
a first connective portion connecting the gate spacer on one sidewall of the first gate electrode to the first gate cut, wherein the first connective portion is at least partially on the upper surface of the field insulating layer and comprises a material that is the same as a material of the gate spacer.

14. The semiconductor device of claim 13, wherein the gate spacer comprises a first sidewall and a second sidewall opposite to the first sidewall in the first horizontal direction,
wherein each of the first and second sidewalls of the gate spacer is in contact with the interlayer insulating layer, and wherein a first width of the first gate cut in the first horizontal direction is smaller than a second width between the first sidewall of the gate spacer and the second sidewall of the gate spacer in the first horizontal direction.

15. The semiconductor device of claim 14, wherein the first gate cut has opposing sidewalls, and wherein each of the opposing sidewalls has a recess that is concave toward a center of the first gate cut.

16. The semiconductor device of claim 13, further comprising:
a third gate electrode on the active pattern and extending in the second horizontal direction, wherein the third gate electrode is spaced apart from the second gate electrode in the first horizontal direction;
a second gate cut dividing the third gate electrode into two portions spaced apart from each other in the second horizontal direction, wherein at least a portion of the second gate cut is in the trench, and wherein the second gate cut comprises a material that is the same as a material of the gate spacer; and
a second connective portion connecting the first gate cut to the second gate cut, wherein the second connective portion comprises a material that is the same as a material of the gate spacer.

17. The semiconductor device of claim 16, wherein at least a portion of the second connective portion is in the trench.

18. The semiconductor device of claim 13, further comprising a third gate cut having opposing sidewalls in the first horizontal direction thereof, wherein the opposing sidewalls of the third gate cut are surrounded with the first gate cut, and wherein each of the opposing sidewalls of the third gate cut has a recess that is concave toward a center of the first gate cut.

19. A semiconductor device comprising:
a first cell region;
a second cell region adjacent to the first cell region in a first horizontal direction;
a comparison region adjacent to each of the first and second cell regions in a second horizontal direction different from the first horizontal direction;
a first gate electrode extending across both the first cell region and the comparison region and in the second horizontal direction;
a second gate electrode extending across both the first cell region and the comparison region and in the second horizontal direction, wherein the second gate electrode is spaced apart from the first gate electrode in the first horizontal direction;
a third gate electrode extending across both the second cell region and the comparison region and in the second horizontal direction, wherein the third gate electrode is spaced apart from the second gate electrode in the first horizontal direction;
an interlayer insulating layer surrounding a sidewall of each of the first to third gate electrodes;
a gate spacer on opposing sidewalls of each of the first to third gate electrodes and extending in the second horizontal direction, wherein the gate spacer comprises a first sidewall and a second sidewall opposite to the first sidewall in the first horizontal direction, and wherein each of the first and second sidewalls is in contact with the interlayer insulating layer;
a first gate cut dividing the second gate electrode into two portions spaced from each other in the second horizontal direction, wherein the first gate cut comprises a material that is the same as a material of the gate spacer; and
a second gate cut dividing the third gate electrode into two portions spaced from each other in the second horizontal direction,
wherein the second gate cut comprises a material that is the same as a material of the gate spacer,
wherein a first width of the first gate cut in the first horizontal direction is smaller than a second width between the first sidewall of the gate spacer and the second sidewall of the gate spacer in the first horizontal direction, and
wherein each of opposing sidewalls of the first gate cut has a recess that is concave toward a center of the first gate cut.

20. The semiconductor device of claim 19, further comprising:
a first connective portion connecting the gate spacer on one sidewall of the first gate electrode to the first gate cut, wherein the first connective portion comprises a material that is the same as a material of the gate spacer; and
a second connective portion for connecting the first gate cut to the second gate cut, wherein the second connective portion comprises a material that is the same as a material of the gate spacer.

* * * * *